US009059328B2

(12) United States Patent
Terano et al.

(10) Patent No.: US 9,059,328 B2
(45) Date of Patent: Jun. 16, 2015

(54) NITRIDE SEMICONDUCTOR ELEMENT AND METHOD OF MANUFACTURING THE SAME

(71) Applicant: Hitachi Metals, Ltd., Tokyo (JP)

(72) Inventors: Akihisa Terano, Tokyo (JP); Kazuhiro Mochizuki, Tokyo (JP); Tomonobu Tsuchiya, Tokyo (JP); Tadayoshi Tsuchiya, Tokyo (JP); Naoki Kaneda, Tokyo (JP); Tomoyoshi Mishima, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 64 days.

(21) Appl. No.: 14/066,104

(22) Filed: Oct. 29, 2013

(65) Prior Publication Data

US 2014/0117376 A1    May 1, 2014

(30) Foreign Application Priority Data

Oct. 30, 2012  (JP) .................................. 2012-238771

(51) Int. Cl.
| H01L 29/00 | (2006.01) |
| H01L 31/00 | (2006.01) |
| H01L 29/872 | (2006.01) |
| H01L 29/40 | (2006.01) |
| H01L 29/66 | (2006.01) |
| H01L 29/20 | (2006.01) |

(52) U.S. Cl.
CPC ............ *H01L 29/872* (2013.01); *H01L 29/402* (2013.01); *H01L 29/66212* (2013.01); *H01L 29/2003* (2013.01)

(58) Field of Classification Search
CPC ............ H01L 29/872; H01L 29/66143; H01L 29/402; H01L 29/66212; H01L 29/2003
See application file for complete search history.

(56) References Cited

U.S. PATENT DOCUMENTS

| 4,982,260 A * | 1/1991 | Chang et al. .................. 257/656 |
| 5,101,244 A * | 3/1992 | Mori et al. .................... 257/471 |
| 2007/0235745 A1* | 10/2007 | Hayashi et al. ................. 257/94 |

FOREIGN PATENT DOCUMENTS

JP        2010-40698 A    2/2010

* cited by examiner

*Primary Examiner* — Victor A Mandala
*Assistant Examiner* — Quovaunda V Jefferson
(74) *Attorney, Agent, or Firm* — Crowell & Moring LLP

(57) ABSTRACT

A nitride semiconductor element having a high reverse breakdown voltage and a method of manufacturing the same are provided. A diode (a vertical-type SBD) has an n⁻-type nitride semiconductor layer (a drift region) formed on an n-type nitride semiconductor substrate, a p-type nitride semiconductor layer formed on the n⁻-type nitride semiconductor layer, and besides, an anode electrode formed on the p-type nitride semiconductor layer. The p-type nitride semiconductor layer has a relatively-thin first portion and a relatively-thick second portion provided so as to surround the first portion as being in contact with an outer circumference of the first portion. Also, the relatively-thin first portion of the p-type nitride semiconductor layer is formed thinner than the second portion so as to be depleted. The relatively-thick second portion of the p-type nitride semiconductor layer forms a guard ring part.

15 Claims, 15 Drawing Sheets

NITRIDE SEMICONDUCTOR ELEMENT AND METHOD OF MANUFACTURING THE SAME

CROSS-REFERENCE TO RELATED APPLICATION

The present application claims priority from Japanese Patent Application No. 2012-238771 filed on Oct. 30, 2012, the content of which is hereby incorporated by reference into this application.

TECHNICAL FIELD OF THE INVENTION

The present invention relates to a nitride semiconductor element and a method of manufacturing the same. For example, the present invention relates to a technique effectively applied to a nitride semiconductor element and a method of manufacturing the same having a Schottky Barrier Diode (hereinafter, abbreviated as SBD) provided on a nitride semiconductor substrate.

BACKGROUND OF THE INVENTION

As a background art of the present technical field, for example, Japanese Patent Application Laid-Open Publication No. 2010-40698 (Patent Document 1) is cited. This Patent Document 1 describes as follows. "The SBD is provided with: an n-type GaN layer formed on a GaN substrate; a Schottky electrode formed thereon; and a back-surface electrode. On the n-type GaN layer, a guard ring having a regular hexagonal ring shape and surrounding the Schottky electrode is provided. The guard ring is formed of a p-type GaN. The Schottky electrode is in contact with an inner side surface and an upper surface of the guard ring in an ohmic contact. A side surface of the guard ring is an "m" plane. The side surface of the guard ring is patterned by plasma etching, and then, is subjected to anisotropic wet etching. By this structure, a leakage current is decreased, and a breakdown voltage is increased" (see the abstract).

SUMMARY OF THE INVENTION

The above-described Patent Document discloses that the guard ring is patterned, and then, is subjected to anisotropic wet etching.

However, the GaN substrate normally used is a c-plane ((001) plane) substrate, and a surface of an n-type GaN layer in contact with an anode electrode of the SBD is a gallium (Ga) plane. Therefore, even if the substrate is subjected to the wet etching by using any solution, the substrate is hardly etched.

That is, even if the surface (Ga plane) of the n-type GaN layer in contact with the anode electrode of the SBD is subjected to plasma etching followed by wet etching, it is difficult to completely remove a damaged layer on the surface of the n-type GaN layer largely damaged by the plasma etching at the largest.

The damaged layer formed on the surface of the n-type GaN layer normally becomes a leakage cause in the element. Therefore, when a damaged layer is formed on the surface of the n-type GaN layer (which is a portion in contact with the anode electrode of the SBD and is also an active region (a drift region) of the SBD), a leakage current in a reverse direction of the SBD increases, and it is difficult to obtain predetermined reverse breakdown voltage characteristics.

Accordingly, the present invention is to provide a nitride semiconductor element having a high reverse breakdown voltage and a method of manufacturing the same.

A summary of the typical ones of the inventions disclosed in the present application will be briefly described as follows.

A nitride semiconductor element according to a typical embodiment has a feature that, between an anode electrode and a nitride semiconductor layer of a first conductive type, a depleted-state nitride semiconductor layer of a second conductive type opposite to the first conductive type is provided.

Also, a method of manufacturing the nitride semiconductor element according to a typical embodiment has a feature including a step of forming, between an anode electrode and a nitride semiconductor layer of a first conductive type, a depleted-state nitride semiconductor layer of a second conductive type opposite to the first conductive type.

The effects obtained by typical aspects of the present invention disclosed in the present application will be briefly described below.

According to the present invention, a nitride semiconductor element having a high reverse breakdown voltage and a method of manufacturing the same can be provided.

Other problems, structures, and effects than those described above will become apparent from the following description of embodiments.

BRIEF DESCRIPTIONS OF THE DRAWINGS

DESCRIPTIONS OF THE PREFERRED EMBODIMENTS

Figure 1:
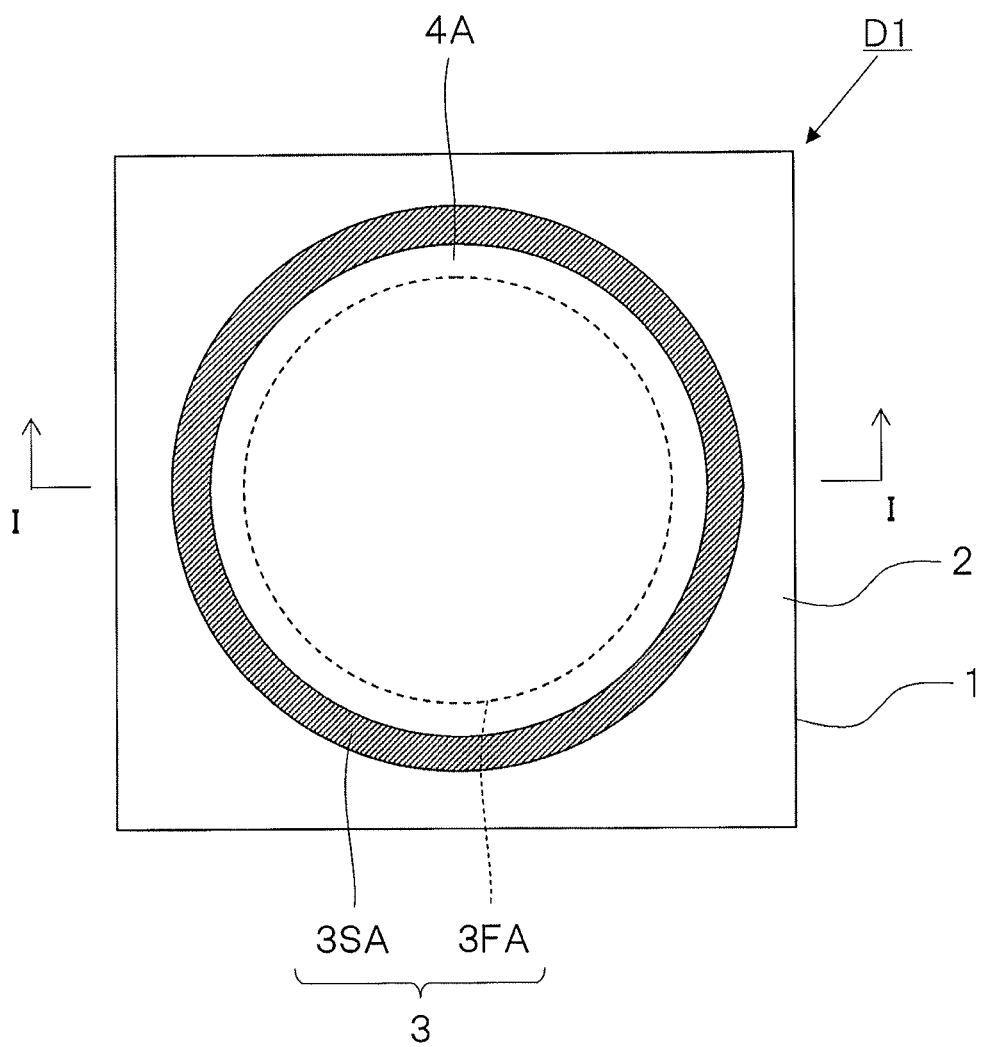
FIG. 1 is an entire plan view of a nitride semiconductor element of a first embodiment of the present invention.

Hereinafter, embodiments of the present invention will be described in detail based on the drawings. Note that components having the same function are denoted by the same reference symbols throughout all drawings for describing the embodiments, and the repetitive description thereof will be omitted.

Also, in the embodiments, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

In addition, in the embodiments, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments, it goes without saying that the components (including element steps) are not always indispensable unless otherwise stated or except the case where the components are apparently indispensable in principle. Similarly, in the embodiments, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

(First Embodiment)

In order to achieve, for example, a vertical-type diode having a high breakdown voltage as a vertical-type nitride semiconductor element having excellent breakdown voltage characteristics, it is preferred to provide a guard ring part formed of p-type GaN.

In order to form this guard ring part, it is required to use plasma etching using chlorine-based gas. By this plasma etching, a damaged layer is formed on the surface of the n-type GaN layer, which is a surface to be etched and where the anode electrode is to be formed.

The Patent Document 1 describes that this damaged layer is removed by the wet etching. However, according to the following evaluation results made by the inventors, the damaged layer is normally caused on the Ga plane which is a surface of an epitaxial layer, and therefore, cannot be removed by only the wet etching. Therefore, it has been found that, when the anode electrode is formed on this damaged layer, the Schottky characteristics are degraded to increase a reverse leakage current, and it is difficult to achieve the diode having the high breakdown voltage.

Here, study results made by the inventors are described. The inventors have manufactured the SBD as described below and evaluated in order to verify an effect described in the Patent Document 1 in which the damaged layer caused by plasma etching is removed by wet etching.

For an experiment, an epitaxial substrate has been used, the substrate being obtained by epitaxially growing a low-concentration n-type GaN layer, a p-type GaN layer, and a p-type GaN Layer to which high-concentration magnesium (Mg) is doped, in an order from a lower layer on an n-type GaN substrate.

A dopant of the low-concentration n-type GaN layer which is the lowermost layer is, for example, silicon (Si), a doping concentration thereof is, for example, $1 \times 10^{16}$ cm$^{-3}$, and a film thickness thereof is, for example, 10 µm.

A dopant of the p-type GaN layer which is a middle layer is, for example, Mg, a doping concentration thereof is, for example, $1 \times 10^{18}$ cm$^{-3}$, and a film thickness thereof is, for example, 500 nm.

Further, a dopant of the p-type GaN layer to which high-concentration magnesium (Mg) is doped and which is the uppermost layer is, for example, Mg, a doping concentration thereof is, for example, $1 \times 10^{20}$ to $2 \times 10^{20}$ cm$^{-3}$, and a film thickness thereof is, for example, 20 nm.

First, all of the p-type GaN layers (that is, the p-type GaN layer to which the high-concentration Mg is doped and the lower p-type GaN layer) on the epitaxial substrate are removed (as an etching amount of about 530 nm) by plasma etching (dry etching) using gas containing chlorine. In this manner, it is assumed that the damaged layer is formed by the dry etching on the surface of the low-concentration n-type GaN layer which is to be in contact with the anode electrode of the SBD.

Subsequently, as the wet etching for removing this damaged layer, the epitaxial substrate is soaked for 60 minutes into 25% TMAH aqueous solution (tetra methyl ammonium hydroxide aqueous solution: heated up to 80° C.) described in the Patent Document 1.

Then, an anode electrode having, for example, a circular shape whose diameter is about 300 μmϕ, is formed on the front surface of the epitaxial substrate, and a cathode electrode is formed on an entire back surface of the n-type GaN substrate of the epitaxial substrate, so that a vertical-type SBD (this is an SBD of a first study example (with a damage removal process)) is completed.

The anode electrode of the SBD of the first study example is made of, for example, palladium (Pd) having a film thickness of 200 nm, and is formed in a state of a Schottky junction with the low-concentration n-type GaN layer. Also, the cathode electrode is formed by, for example, depositing titanium (Ti) and aluminum (Al) sequentially from the back surface side of the n-type GaN substrate, and is formed in a state of an ohmic junction with the back surface of the n-type GaN substrate.

For comparison, for example, the following two SBDs are manufactured. That is, one of them is a SBD manufactured by forming the anode electrode formed on the front surface of the low-concentration n-type GaN layer in a state that the damaged layer remains so as not to perform the wet etching after the above-described dray etching and forming the cathode electrode on the back surface of the n-type GaN substrate (this is an SBD of a second study example (without the damage removal process)).

And, the other one is a standard SBD manufactured by epitaxially growing the low-concentration n-type GaN layer (its specifications such as the doping and the film thickness are similar to those described above) on the n-type GaN substrate, forming the anode electrode on the front surface of the low-concentration n-type GaN layer, and forming the cathode electrode on the back surface of the n-type GaN substrate (this is an SBD of a third study example (a standard example).

Figure 22:
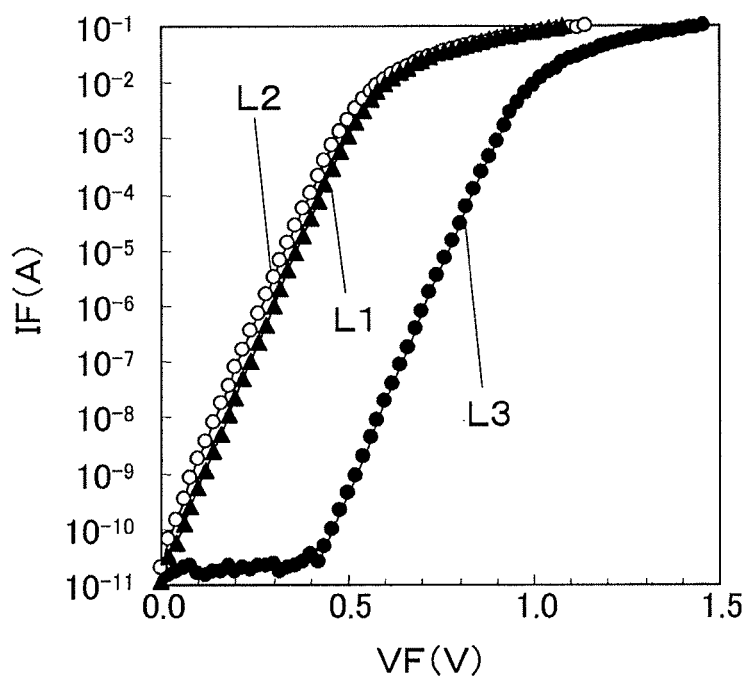
FIG. 22 is a graph illustrating evaluation results of forward current-voltage characteristics of SBD of three types studied by the present inventors.
Figure 23:
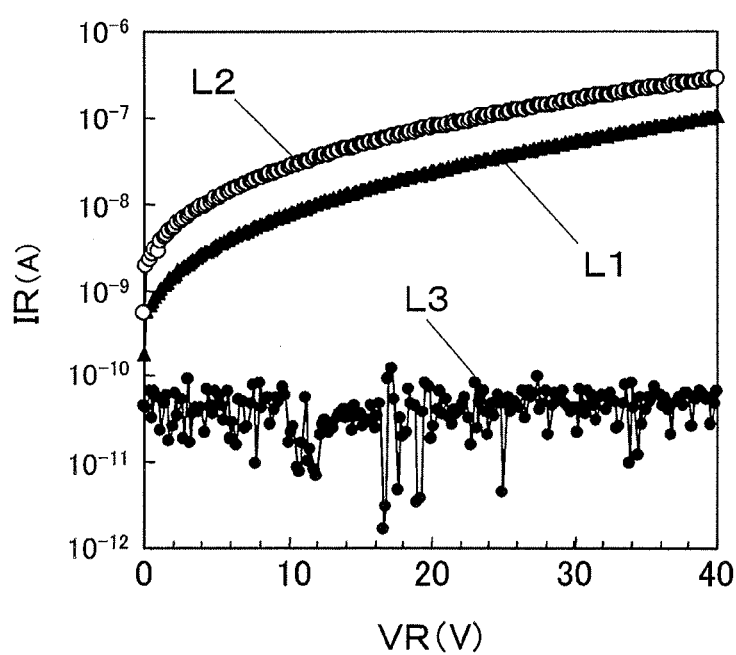
FIG. 23 is a graph illustrating evaluation results of reverse current-voltage characteristics of the SBD of three types studied by the present inventors.

Next, FIGS. 22 and 23 are diagrams graphing evaluation results of forward current-voltage characteristics and reverse current-voltage characteristics of the SBD of the three types, respectively. In the graphs illustrating diode characteristics below, note that a symbol "IF" indicates a forward current, a symbol "VF" indicates a forward voltage, a symbol "IR" indicates a reverse leakage current, and a symbol "VR" indicates a reverse voltage.

A characteristic line L1 (illustrated with black triangles) indicates the forward current-voltage characteristics (hereinafter simply referred to as forward characteristics) and the reverse current-voltage characteristics (hereinafter simply referred to as reverse characteristics) of the SBD of the first study example (with the damage removal process).

Also, a characteristic line L2 (illustrated with white circles) indicates forward characteristics and reverse characteristics of the SBD of the second study example (without the damage removal process).

Further, a characteristic line L3 (illustrated with black circles) indicates forward characteristics and reverse characteristics of the SBD of the third study example (the standard example).

As illustrated in FIG. 22, as the forward characteristics of the standard SBD indicated by the characteristic line L3, for example, a favorable Schottky junction with an "n" value of 1.02 which is nearly ideal has been obtained, and a Schottky barrier height "ϕb" caused by the anode electrode (hereinafter simply referred to as ϕb) has been a high value of 1.2 eV. Also, as illustrated in FIG. 23, in the standard SBD indicated by the characteristic line L3, a leakage current has not been clearly confirmed even in the reverse characteristics in the evaluation, for example, down to −40 V.

By contrast, as illustrated in FIG. 22, in the forward characteristic of the SBD indicated by the characteristic line L2 of the second study example (without the damage removal process), while the characteristics have had a favorable junction state with an n value of 1.05, it has showed characteristics of increase in the current immediately after voltage application, and the ϕb has showed 0.7 eV. or lower at this time. Also, as illustrated in FIG. 23, the SBD indicated by the characteristic line L2 of the second study example (without the damage removal process) has had a tendency of increase in the leakage current together with increase in a negative voltage even in the reverse characteristics.

As a forward rising voltage (a built-in voltage: hereinafter referred to as VFin) for both of them, the standard SBD indicated by the characteristic line L3 has had 0.8 V whereas the SBD indicated by the characteristic line L2 of the second study example (without the damage removal process) has had about 0.4 V.

The results described above clearly show how presence or absence of the damaged layer on the front surface of the low-concentration n-type GaN layer caused by the dry etching affects the diode characteristics. And, from these results, it can be found that there is a tendency of degradation in the diode characteristics, more particularly, decrease in the ϕb, which results in significant increase in the reverse leakage current, because of the damaged layer on the front surface of the low-concentration n-type GaN layer existing immediately below the anode electrode.

Accordingly, by removing the damaged layer due to the dry etching by the wet etching, it has been expected that these characteristics come close to the forward characteristics and the reverse characteristics (indicated by the characteristic line L3) of the third study example (standard example) illustrated in FIGS. 22 and 23.

However, the forward characteristics and the reverse characteristics (indicated by the characteristic line L1) of the SBD of the first study example which has been subjected to the wet etching have been hardly different from the forward characteristics and the reverse characteristics (indicated by the characteristic lines L2) of the SBD of the second study example with the state that the damage due to the dry etching remains. This suggests that the damaged layer formed on the front surface (Ga plane) of the low-concentration n-type GaN layer is not sufficiently removed by the wet etching.

Regarding the etching amount of the semiconductor obtained by the wet etching applied at this time, an epitaxial substrate that has grown to the p-type GaN layer has been used, and the epitaxial substrate has been etched by about 600 nm by the dry etching with using a $SiO_2$ film having a film thickness of 500 nm as a mask so as to provide a step. Then, the epitaxial substrate has been soaked into the TMAH aqueous solution for 60 minutes while the $SiO_2$ film remains, and the steps obtained before and after the soaking have been compared with each other.

As a result, while the back surface (N plane) of the n-type GaN substrate has been unevenly etched to be cloudy whiten as much as a mirror plane is lost, no clear change has been observed in the steps before and after the soaking on the front surface (Ga plane) of the GaN layer including the step of the $SiO_2$ film. This means that GaN of the front surface (Ga plane)

of the epitaxial substrate cannot be etched with the TMAH aqueous solution in a depth direction.

From this result, it has been found that it is difficult to provide the nitride semiconductor element excellent in the reverse characteristics in the manufacture of the nitride semiconductor element including the anode electrode making the Schottky junction with the front surface (Ga plane) of the dry-etched nitride semiconductor element.

Next, the present inventors have seriously studied a structure of the element from which favorable diode characteristics can be obtained by significantly reducing the influence of the damage on the front surface of the nitride semiconductor due to the dry etching.

As a result, the inventors have taken a structure (which is a first portion described later) that the p-type GaN layer remains so as to be thin on a surface to be etched by providing an appropriate impurity concentration and an appropriate film thickness range in accordance with the concentration (described later with reference to FIGS. 9 and 10) when the plasma etching is performed on a region where the anode electrode is formed. In this manner, the inventors have found that the influence of the damaged layer due to the plasma etching can be significantly reduced.

By applying this structure to manufacture the diode, the favorable Schottky characteristics (with keeping the VFin low) and the low reverse leakage current characteristics can be obtained.

Also, by providing a guard ring part (which is a second portion described later) formed of the p-type GaN to the structure, the reverse breakdown voltage characteristics of the diode can be improved.

Further, by providing a later-described field plate electrode (described in third and fourth embodiments later), a nitride semiconductor element having both of the low VFin and the reverse characteristics with the high breakdown voltage and the low leakage current can be achieved.

Hereinafter, the structure of the nitride semiconductor element of the first embodiment is described below.

Figure 2:
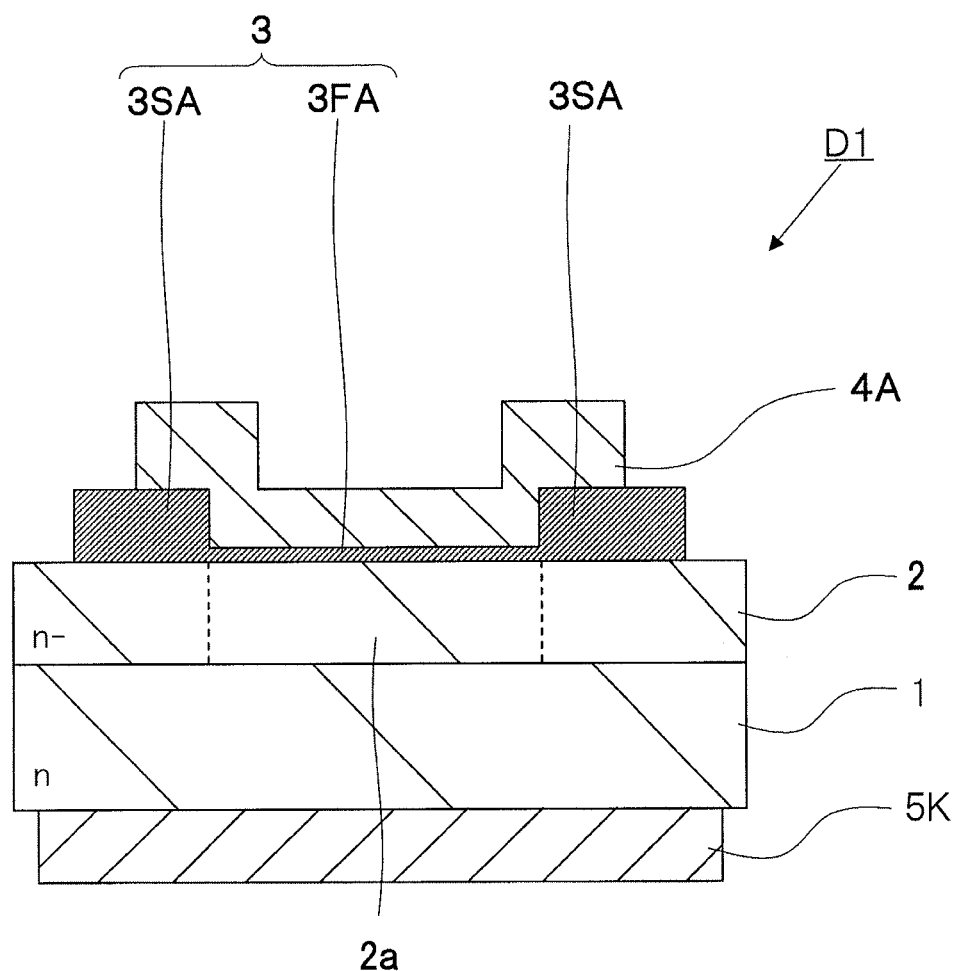
FIG. 2 is a cross-sectional view taken along a line I-I of FIG. 1.

FIG. 1 is an entire plan view of a diode D1 which is the nitride semiconductor element of the first embodiment, and FIG. 2 is a cross-sectional view taken along a line I-I of FIG. 1.

The diode D1 which is the nitride semiconductor element of the first embodiment is, for example, a vertical-type SBD. An n-type nitride semiconductor substrate (hereinafter simply referred to as a substrate) 1 forming the diode D1 is formed of, for example, n-type GaN, and has a first surface and a second surface on a back side of the first surface.

On the first surface of the substrate 1, an $n^-$-type nitride semiconductor layer (a nitride semiconductor layer of a first conductive type: hereinafter simply referred to as an $n^-$-type layer) 2 having a low impurity concentration is provided in contact with the first surface. This $n^-$-type layer 2 is formed of, for example, n-type GaN. A dopant contained in the $n^-$-type layer 2 is, for example, silicon (Si), and its doping concentration is, for example, $1 \times 10^{16}$ cm$^{-3}$. Also, the $n^-$-type layer 2 has a thickness of, for example, 10 μm. Further, in the $n^-$-type layer 2, a drift region 2a serving as an element active region is formed.

On this $n^-$-type layer 2, a p-type nitride semiconductor layer (a nitride semiconductor layer of a second conductive type: hereinafter simply referred to as a p-type layer) 3 is provided in contact with the $n^-$-type layer 2. This p-type layer 3 is formed of, for example, p-type GaN.

Also, the P-type layer 3 has a first portion 3FA positioned at the center and having a planar circular shape or others and a second portion 3SA surrounding the first portion 3FA in contact with the first portion 3FA and having a flat ring shape. Note that the first portion 3FA has a diameter of, for example, 300 μmφ, and the second portion 3SA has a width of, for example, 50 μm.

A dopant of the p-type layer 3 (the first portion 3FA and the second portion 3SA) is, for example, Mg, and its doping concentration is, for example, $1 \times 10^{18}$ cm$^{-3}$. Note that, although a nitride semiconductor layer having a high impurity concentration is provided on the most-front surface of the second portion 3SA as similar to the epitaxial substrate used for the above-described verification, this is omitted in the drawing. The dopant of this high-impurity-concentration nitride semiconductor layer is, for example, Mg, its doping concentration is, for example, $2 \times 10^{20}$ cm$^{-3}$, and its thickness is, for example, 20 nm.

The first portion 3FA of the p-type layer 3 is positioned on the drift region 2a of the $n^-$-type layer 2. As described later, the first portion 3FA is formed of a residual portion obtained by forming a silicon oxide (such as SiO$_2$) film on an upper surface of the p-type layer 3 (an upper surface of the second portion 3SA), and then, processing the p-type layer 3 by the dry etching using the chlorine-based gas with using the silicon oxide film as an etching mask.

A thickness of the first portion 3FA (a thickness as much as the p-type layer 3 remains) is set to a thickness as much as a later-described anode electrode 4A is entirely depleted in a thickness direction with being adhered. In the diode D1 manufactured in the first embodiment, the thickness of the first portion 3FA after the dry etching has been controlled to be, for example, in a range of 10 nm to 15 nm.

On the other hand, the second portion 3SA of the p-type layer 3 is a so-called guard ring part, and relaxes electric field concentration in the $n^-$-type layer 2 below an outer circumference of the later-described anode electrode 4A. The second portion 3SA is formed so as to be thicker than the first portion 3FA inner than the second portion 3SA, and has a thickness of, for example, 520 nm which is a film thickness obtained at the epitaxial growth of the p-type layer 3.

On such a p-type layer 3, the above-described anode electrode 4A is provided in contact with only the p-type layer 3. The anode electrode 4A is provided in the state of the Schottky junction with the upper surface of the first portion 3FA. Also, the anode electrode 4A anode electrode 4A is provided in contact with a part of the upper surface and the inner side surface of the second portion 3SA, and is provided in the state of the ohmic junction with at least the upper surface of the second portion 3SA (the upper surface of the high-impurity-concentration nitride semiconductor layer).

Such an anode electrode 4A is made of a metal such as palladium (Pd). However, the anode electrode 4A is in contact with the p-type layer 3, and therefore, even if an electrode material which causes the ohmic junction in the case of the n-type layer is used, the Schottky junction can be provided. Therefore, a selection range of the material of the anode electrode 4A can be widened. Therefore, the material of the anode electrode 4A is not limited to Pd, and, for example, molybdenum (Mo) may be used.

Note that a cathode electrode 5K is provided on the second surface of the substrate 1 in the state of the ohmic junction with the second surface. The cathode electrode 5K is formed by, for example, depositing titanium (Ti) and aluminum (Al) sequentially from the second surface side.

Figure 3:
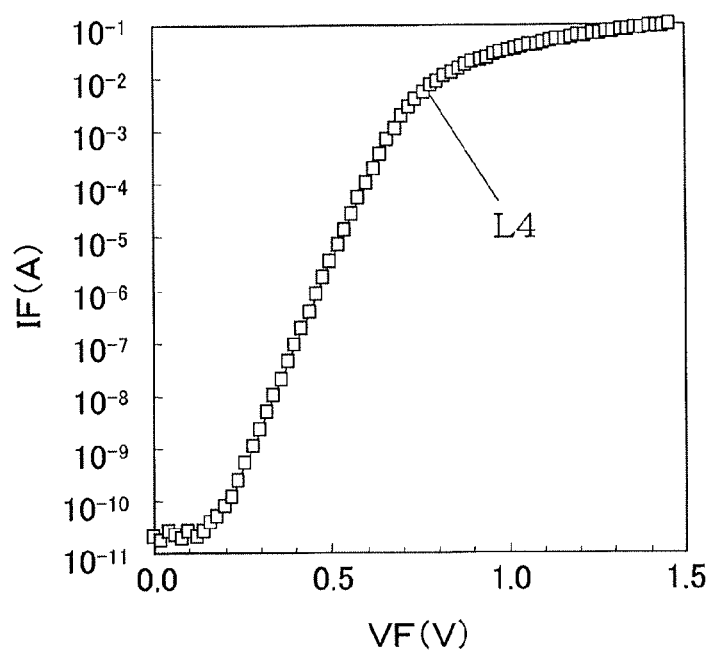
FIG. 3 is a graph illustrating evaluation results of forward current-voltage characteristics of the nitride semiconductor element of FIG. 1.
Figure 4:
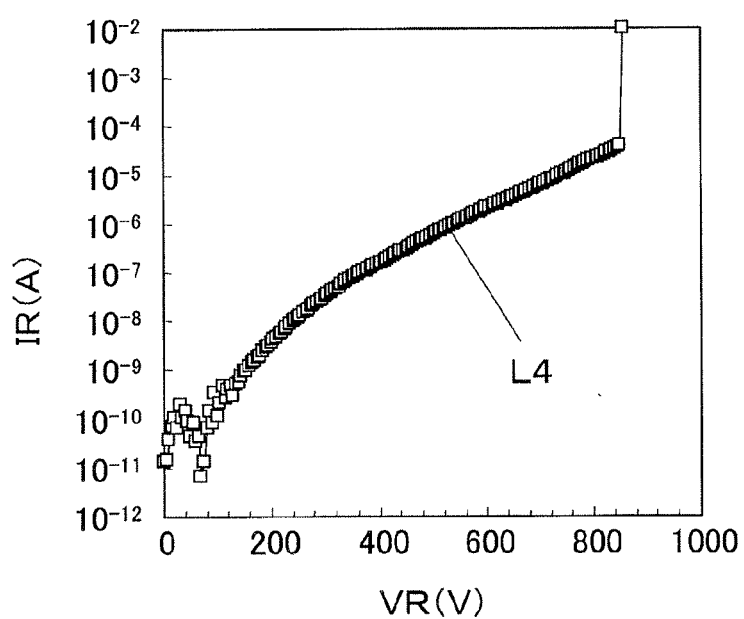
FIG. 4 is a graph illustrating evaluation results of reverse current-voltage characteristics of the nitride semiconductor element of FIG. 1.

Next, FIGS. 3 and 4 are graphs of evaluation results (characteristic line L4 (illustrated with white squares) of the forward characteristics and the reverse characteristics of the diode D1 of the first embodiment, respectively.

According to the forward characteristics (illustrated by the characteristic line L4) illustrated in FIG. 3, the φb is 1.0 eV which is a slightly lower value than that of the (standard example) SBD indicated by the characteristic line L3 of FIG. 22 but is a higher value than those of the SBDs (with and without the damage removal process) indicated by the characteristic lines L1 and L2 of FIG. 22. Also, in the diode D1 of the first embodiment, it has been found that a favorable junction with the n value of 1.07 is obtained.

Further, in the diode D1 of the first embodiment, the VFin has been, for example, about 0.7 V which is a lower value than that of the characteristic line L3 (standard example) by about 0.1 in accordance with the φb value. However, according to the reverse characteristics (indicated by the characteristic line L4) illustrated in FIG. 4, the high breakdown voltage characteristics has been obtained with a breakdown voltage of, for example, 850 V.

From the above description, by applying the structure of the first embodiment, the influence of the damaged layer on the front surface of the n⁻-type layer 2 (GaN) due to the dry etching can be reduced to achieve the diode D1 having the high breakdown voltage and the low VFin.

Next, a background for obtaining the structure of the diode D1 of the first embodiment is described below.

First, as the characteristics required for the diode, while it is desired that the reverse characteristics have the low leakage current and the high breakdown voltage, it is desired that the forward characteristics have the VFin as low as possible in order to reduce the loss.

Here, a tendency is known when an SBD and a pn-junction-type diode are compared with each other, the tendency showing that the pn-junction-type diode can obtain a performance more excellent in the reverse characteristics with the low leakage current and the high breakdown voltage whereas the VFin is higher than that of the Schottky-junction type in accordance with a semiconductor band gap.

Therefore, in order to achieve the diode having the low VFin as low as that of the SBD and the high breakdown voltage/low leakage current characteristics as much as the pn-junction-type diode, a JBS (Junction Barrier Schottky) which is a composite of the SBD and the pn-junction-type diode or others has been commercialized.

However, the JBS or others is complicated and requires high accuracy, and therefore, an important task is how the diode having the low VFin and the high breakdown voltage/low leakage current characteristics is obtained with a simple structure.

Accordingly, first, in the SBD formed on the nitride semiconductor substrate, decrease in the reverse breakdown voltage due to the damage by the dry etching at a contact surface between the anode electrode and the low-concentration n-type GaN layer (corresponding to the n⁻-type layer 2) has been studied.

And, from a difference in the diode characteristics between the characteristic line L2 (the second study example without the damaged-layer removal process) and the characteristic line L3 (standard example) illustrated in FIG. 22, it has been estimated that the damaged layer caused on the low-concentration n-type GaN layer by the dry etching has become an n-type layer having a carrier density or a donor density electrically higher than that of the initial low-concentration n-type GaN layer. From the 0 value obtained with the characteristic line L2, it has been estimated that the donor density of the damaged layer is about $1 \times 10^{17}$ cm$^{-3}$ which is about one digit higher than an initial value.

Figure 24:
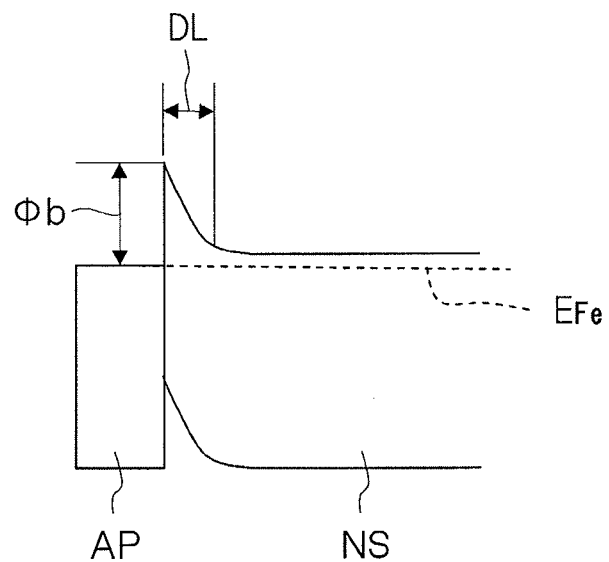
FIG. 24 is an energy band diagram at the Schottky junction part without a damaged layer.
Figure 25:
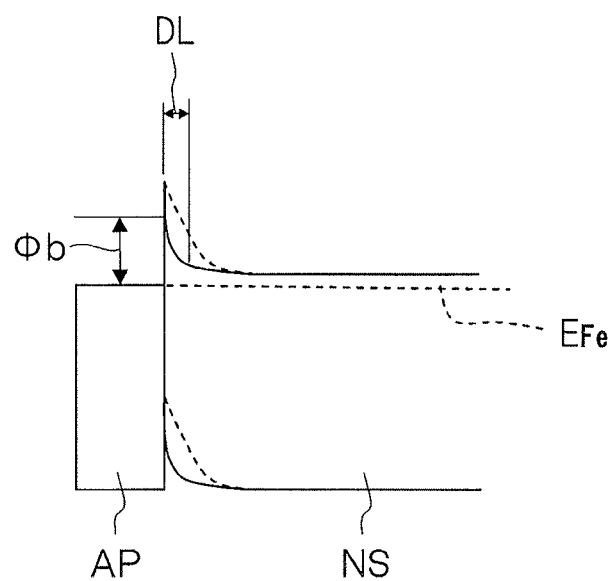
FIG. 25 is an energy band diagram at the Schottky junction part with the damaged layer.

Here, model diagrams of the energy bands of the Schottky junction part with and without the damaged layer based on the above-described estimation are described. FIG. 24 is an energy band diagram at the Schottky junction part without the damaged layer, and FIG. 25 is an energy band diagram at the Schottky junction part with the damaged layer. A reference symbol "AP" indicates the anode electrode, a reference symbol "NS" indicates the low-concentration n-type GaN layer, a reference symbol "DL" indicates the depletion layer, and a reference symbol "$E_{Fe}$" indicates the Fermi level.

In the case of the low-concentration n-type GaN layer NS with the damaged layer (FIG. 25), the front surface of the low-concentration n-type GaN layer NS becomes an n type with a high concentration by the damaged layer. And, the φb in the case with the damaged layer (FIG. 25) is decreased lower than that of the case without the damaged layer (FIG. 24). Further, a width of the depletion layer DL in the case with the damaged layer (FIG. 25) is narrower than that of the case without the damaged layer (FIG. 24), and therefore, tunneling phenomenon tends to occur. For this reason, it can be estimated that the reverse breakdown voltage of the diode decreases.

Accordingly, in order to cancel the conductive type of the n-type damaged layer, it has been thought that even the damaged layer caused by the dry etching on the front surface of the same layer can be compensated by an acceptor in a p-type layer by providing a p-type layer whose type is opposite to the n type, more specifically, providing a p-type layer having an acceptor density equal to or higher than the donor density, so that a problem does not arise.

In the diode D1 of the first embodiment manufactured for verifying the thought, the first portion 3FA of the p-type layer 3 has thinly remained on the surface to be dry-etched, and the thick second portion 3SA has been provided so as to surround the thin first portion 3FA. Further, the anode electrode 4A has been structured to provide the ohmic junction with the upper surface of the second portion 3SA. In these manners, the estimation described above is supported, and besides, the effect of the relaxation of the electric field concentration by the second portion 3SA is added, so that the high reverse breakdown voltage characteristics can be obtained.

Therefore, even if the damaged layer is formed by the dry etching on the surface where the Schottky electrode is formed (the front surface of the first portion 3FA), the diode D1 excellent in the reverse breakdown characteristics can be achieved by applying the structure of the first embodiment. This is because the conductive type of the first portion 3FA formed of the p-type layer 3 is not significantly changed to the n type even if donors are increased on the most front surface thereof by the damage due to the dry etching. That is, this is because the conductive type of the first portion 3FA is basically difficult to change to the n type since the resistance of the GaN itself is significantly increased by setting the conductive type of the first portion 3FA as the p type. Therefore, the high reverse breakdown voltage can be obtained even if the first portion 3FA is formed by dry etching the p-type layer 3.

Also, in order to significantly reduce the influence of the damaged layer due to the dry etching, as the acceptor density of the first portion 3FA of the p-type layer 3 below the anode electrode 4A, at least a density of $1 \times 10^{17}$ cm$^{-3}$ or higher which is equivalent to the estimated value of the donor density of the damaged layer is required.

Therefore, as the Mg doping concentration of the first portion 3FA of the p-type layer 3, at least a concentration of $1 \times 10^{17}$ cm$^{-3}$ is required, and a higher concentration is preferable.

In the first embodiment, it has been found by the study of the inventors that the reverse breakdown voltage can be improved by setting the impurity concentration of the first portion 3FA of the p-type layer 3 as, for example, $1\times10^{18}$ cm$^{-3}$, and setting the thickness of the first portion 3FA of the p-type layer 3 as, for example, a range of 10 to 15 nm.

Next, the VFin of the SBD formed on the nitride semiconductor substrate has been studied.

As described above, it is known that the VFin of the SBD is generally lower than that of the pn-junction diode. However, if the first portion 3FA of the p-type layer 3 of the diode is too thick, it is estimated that the VFin of the diode is increased by the pn junction between the p-type first portion 3FA and the n$^-$-type layer 2 higher than the Schottky junction between the anode electrode 4A and the first portion 3FA.

Figure 5:
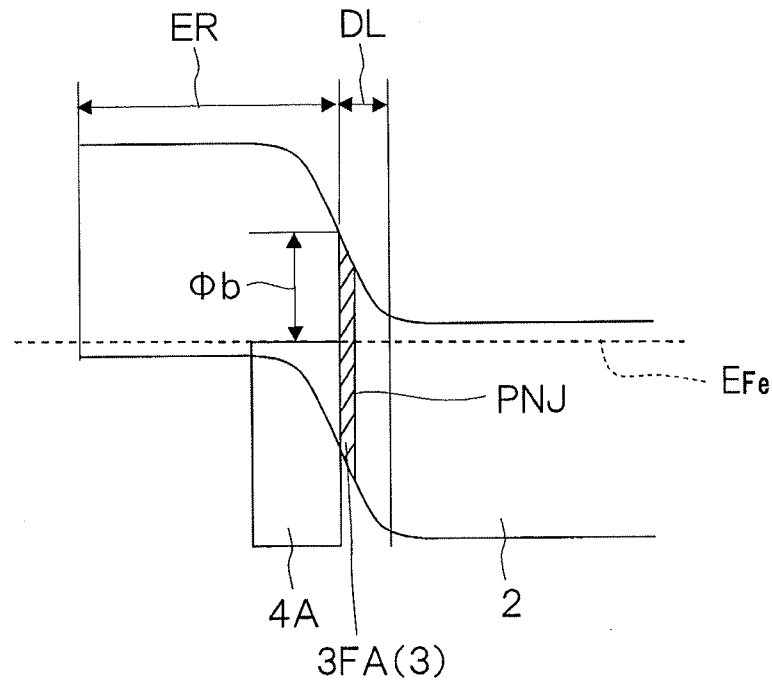
FIG. 5 is an energy band diagram at a Schottky junction part of the nitride semiconductor element of FIG. 1.
Figure 6:
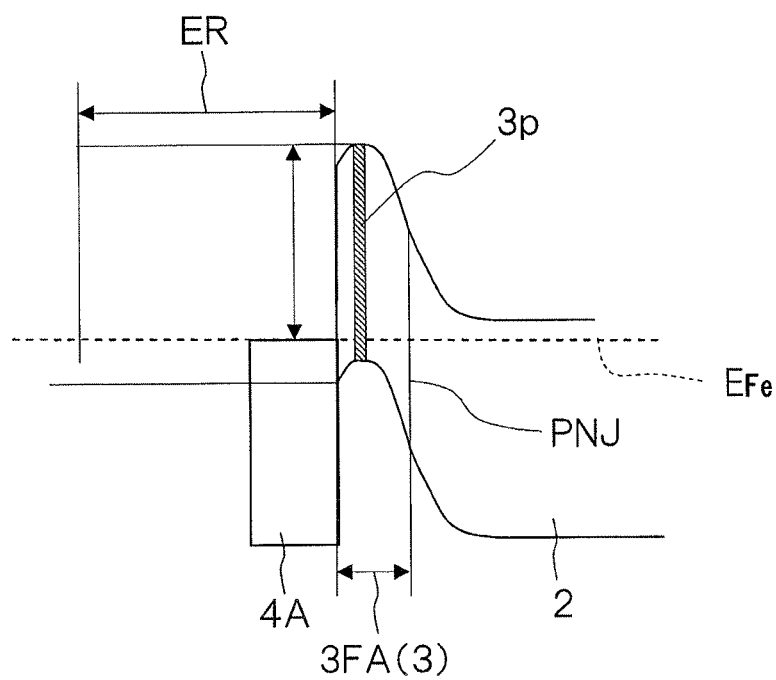
FIG. 6 is an energy band diagram at the Schottky junction part illustrating a case that a first portion of a p-type nitride semiconductor layer of the nitride semiconductor element of FIG. 1 is too thick for comparison.

Here, model diagrams of energy bands of the Schottky junction part based on the estimation are described. FIG. 5 is an energy band diagram at the Schottky junction part of the diode D1 of the first embodiment, and FIG. 6 is an energy band diagram at the Schottky junction part in the case that the first portion 3FA of the p-type layer 3 is too thick, illustrated for comparison. In FIGS. 5 and 6, a reference symbol "ER" indicates an etching removal region, and a reference symbol "PNJ" indicates a pn junction interface. Note that a junction position between the anode electrode 4A and the semiconductor is determined by a type of the metal (that is, a work function) structuring the anode electrode 4A.

In the diode D1 of the first embodiment, in the state that the p-type layer 3 is etched to be thin as illustrated in FIG. 5, the first portion 3FA (a hatched part in FIG. 5) of the p-type layer 3 is depleted from the most front surface (a contact surface with the anode electrode 4A) of the first portion 3FA to the pn junction interface PNJ.

On the other hand, if the first portion 3FA of the p-type layer 3 is too thick as illustrated in FIG. 6, a p-type layer 3$p$ (a hatched part in FIG. 6) not depleted remains from the most front surface (the contact surface with the anode electrode 4A) of the first portion 3FA to the pn junction interface PNJ, and therefore, the diode is changed into the pn-junction diode. Therefore, the VFin of the SBD is increased up to a voltage (such as 3 V or higher) in accordance with the pn junction.

Therefore, in order to decrease the VFin of the diode D1, it is important to control the thickness and the impurity concentration of the first portion 3FA of the p-type layer 3 each in an appropriate range so that the p-type layer 3$p$ does not remain in the first portion 3FA (that is, the first portion 3FA is completely depleted). Note that the impurity concentration of the first portion 3FA is preferably in the above-described range.

Next, in order to obtain an optimum range of the thickness of the first portion 3FA, the diodes with the first portions 3FA having various thicknesses have been manufactured by changing the residual thickness of the p-type layer 3 caused by the dry etching using the above-described epitaxial substrate. The results of evaluating the VFin of each of these diodes are described below.

Figure 7:
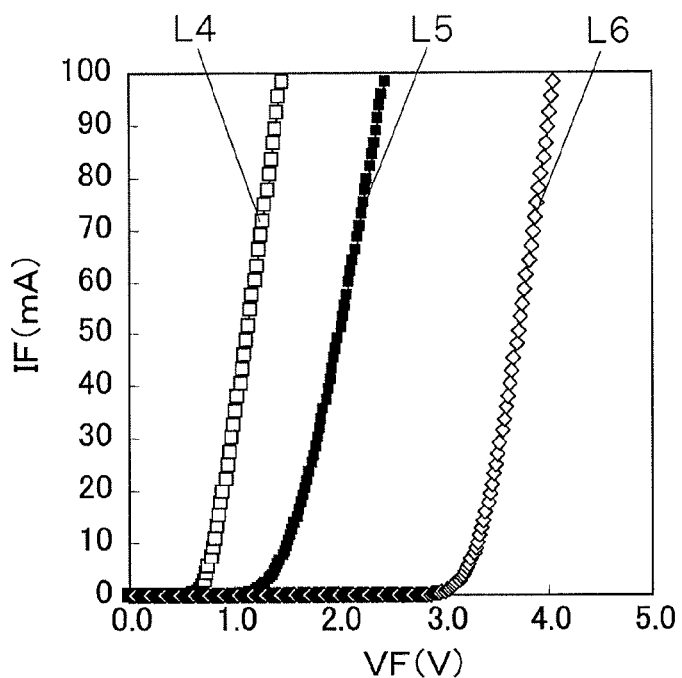
FIG. 7 is a graph of evaluation results of forward current-voltage characteristics of diodes of three types each varied in a thickness of the first portion of the p-type nitride semiconductor layer.

FIG. 7 is a graph of the evaluation results of forward characteristics (linear plots) of the diodes of three types having various thicknesses of the first portion 3A of the p-type layer 3.

A characteristic line L5 indicates characteristics of the diode manufactured so as to control the thickness of the first portion 3FA (the thickness in which the p-type layer 3 remains) to, for example, 35 to 40 nm. Also, a characteristic line L6 indicates characteristics of the diode manufactured so as to control the thickness of the first portion 3FA (the thickness in which the p-type layer 3 remains) to, for example, 100 to 110 nm.

As estimated above, the VFin of the diode tends to increase more as the first portion 3FA becomes thicker. That is, the VFin of the diode D1 of the first embodiment indicated by the characteristic line L4 has showed about 0.6 V, the VFin of the diode indicated by the characteristic line L5 has showed about 1.3 V, and the VFin of the diode indicated by the characteristic line L6 has showed about 3.1 V which is almost equal to that of the pn-junction diode.

Figure 8:
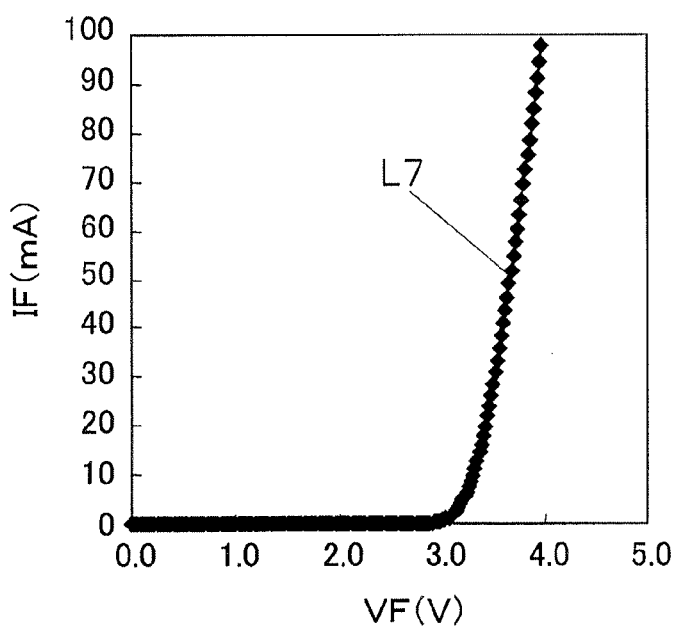
FIG. 8 is a graph of evaluation results of forward current-voltage characteristics in a case that an impurity concentration of the first portion of the p-type nitride semiconductor layer is increased.

Next, FIG. 8 is a graph of evaluation results of the forward characteristics in a case that the impurity concentration of the p-type layer 3 in the above-described epitaxial substrate is high. A characteristic line L7 indicates characteristics of the diode manufactured so as to increase the doping concentration of the p-type layer 3 to $5\times10^{18}$ cm$^{-3}$ higher than $1\times10^{18}$ cm$^{-3}$ and so as to control the thickness (the residual thickness) of the first portion 3FA to 35 to 40 nm equal to that of the diode indicated by the characteristic line L5.

As similar to the diode indicated by the characteristic line L6 of FIG. 7, the VFin of the diode indicated by the characteristic line L7 has showed a value almost equal to that of the pn-junction diode.

Figure 9:
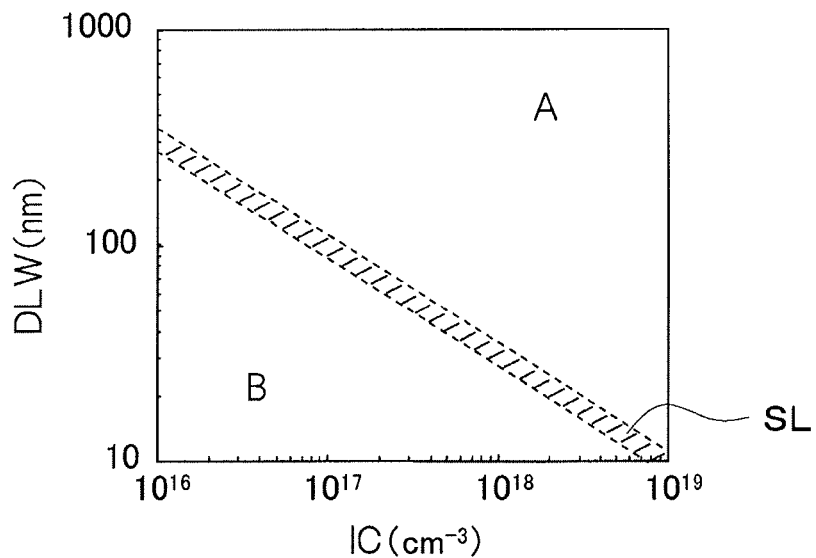
FIG. 9 is a graph illustrating results obtained by calculating a relation between the impurity concentration (acceptor density) in the p-type nitride semiconductor and a width of a depletion layer in the p-type nitride semiconductor caused by a Schottky junction of an anode electrode.

Next, FIG. 9 is a graph of results obtained by calculating a relation between the impurity concentration (acceptor density) in the p-type nitride semiconductor and a width of the depletion layer in the p-type nitride semiconductor caused by the Schottky junction with the anode electrode 4A. Note that, in the following, a reference symbol "DLW" indicates the depletion layer width and a reference symbol "IC" indicates the impurity concentration in the drawing illustrating the relation between the impurity concentration and the depletion layer width.

Since the depletion layer width DLW is changed also by the work function of the component metal of the anode electrode 4A in contact with the nitride semiconductor, it has been found by calculation that the depletion layer width is almost in a range illustrated with a hatched part "SL" in the drawing by applying metal materials in a range of being applicable for the Schottky electrode.

This drawing illustrates that the depletion layer width tends to be changed by about one digit when the impurity concentration in the nitride semiconductor is changed by two digits.

Also, this drawing illustrates that, when the thickness (the residual thickness) of the first portion 3FA with respect to the impurity concentration belongs to an area "A" upper than the hatched part SL, a non-depleted p-type GaN region (the p-type layer 3$p$ of FIG. 6) is caused in the first portion 3FA.

On the other hand, this drawing illustrates that, when the thickness of the first portion 3FA belongs to the hatched part SL and a thickness in an area "B" lower than the hatched part SL, the first portion 3FA is entirely depleted. More specially, when the thickness of the first portion 3FA is within a range of the area B, it can be found by calculation that the depletion layer spreads from the Schottky junction part to the n$^-$-type layer 2 below the first portion 3FA.

Note that the depletion layer is caused even at the pn junction part between the p-type first portion 3FA and the n$^-$-type layer 2, and the depletion layer width DLW spreading into the first portion 3FA is changed by the impurity concentration of the first portion 3FA.

Figure 10:
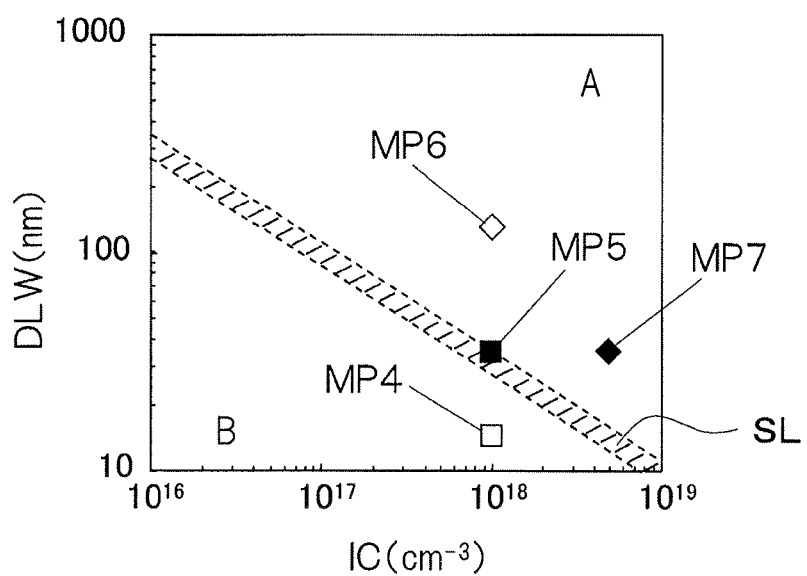
FIG. 10 is a graph plotting, in the graph of FIG. 9, a relation between impurity concentrations and heights of the first portions (residual thickness) of nitride semiconductor elements of four types including the nitride semiconductor element of FIG. 1.

Next, FIG. 10 is a graph plotting, in the graph of FIG. 9, a relation between the impurity concentration and the height of the first portion (the residual thickness) of each of the diodes of four types including the diode D1 of the first embodiment.

A reference symbol MP4 (illustrated with a white square) indicates a calculation value of the diode D1 indicated by the characteristic line L4 of the first embodiment, a reference symbol MP5 (illustrated with a black square) indicates a calculation value of the diode indicated by the characteristic line L5, a reference symbol MP6 (illustrated with a white rhombus) indicates a calculation value of the diode indicated by the characteristic line L6, and a reference symbol MP7 (illustrated with a black rhombus) indicates a calculation value of the diode indicated by the characteristic line L7.

First, in the cases (of the calculation values MP6 and MP7) of the diodes indicated by the characteristic lines L6 and L7 having the VFin of 3 V or higher, the thicknesses (the residual thicknesses) of the first portions 3FA of both of them are within the region of the area A upper than the hatched part SL. Therefore, it is estimated that the non-depleted p-type GaN region (corresponding to the p-type layer 3p of FIG. 6) exists in the first portions 3FA of the diodes indicated by the characteristic lines L6 and L7.

Next, in the case (of the calculation value MP5) of the diode indicated by the characteristic line L5 having the VFin of about 1.3 V, the thickness (the residual thickness) of the first portion 3FA is positioned almost at a boundary between the hatched part SL and the area A. The VFin of the diode indicated by the characteristic line L5 is clearly lower than the VFin controlled by the influence of the pn junction. Therefore, it can be said that the thickness (the residual thickness: for example, 35 to 40 nm) of the first portion 3FA of the diode indicated by the characteristic line L5 can be within a range of the optimum value in a viewpoint of the achievement of the low VFin which is a predetermined purpose of the first embodiment. That is, it is estimated that the first portion 3FA of the diode indicated by the characteristic line L5 is almost depleted by the depletion layer spreading from the Schottky junction part and the pn-junction part.

The VFin of the diode indicated by the characteristic line L5 has been higher than the VFin of the standard SBD (in which the VFin of the diode indicated by the characteristic line L3 is 0.8 V). As a cause of this, it is estimated that the VFin is slightly high since the VFin is not a little influenced by band bending from the pn-junction part, briefly, the residual thickness is relatively thick within the optimum range, in consideration of the residual thickness of the first portion 3FA being positioned at the boundary with the area A.

Next, in the case (of the calculation value MP4) of the diode D1 indicated by the characteristic line L4 having the VFin of about 0.7 V lower than that of the normal SBD, the thickness (the residual thickness) of the first portion 3FA is positioned within the area B lower than the hatched part SL.

This means that the depletion layer from the Schottky junction part has reached the n⁻-type layer 2 as similar to the normal SBD, and it is an undeniable possibility that the thickness is slightly too thin as the thickness of the first portion 3FA. Moreover, a depth of the damaged layer caused by the dry etching is unknown. Therefore, it has been thought that the reverse breakdown voltage characteristics are influenced. However, practically, as illustrated in FIG. 4, the leakage current immediately before the breakdown has been on the order of $1 \times 10^{-6}$ A, and the reverse breakdown voltage has been showed as 850 V which is the sufficiently high breakdown voltage characteristics.

Further, all the reverse characteristics of the diodes indicated by the characteristic lines L5, L6, and L7 having the high VFin have had the low leakage current immediately before the breakdown of $1 \times 10^{-6}$ A or lower, and the breakdown voltages have been in a range of 800 to 860 V, which is equivalent to the above-described one.

This suggests that the influence of the damaged layer caused by the dry etching can be significantly reduced as long as the front surface of the nitride semiconductor in contact with the anode electrode 4A is of the p type, in other words, as long as the semiconductor is a nitride semiconductor to which impurities forming the p type are doped more than a predetermined certain amount.

In the diode D1 of the first embodiment, it can be judged from the above description that consistency can be seen between the thickness of the first portion 3FA of the p-type layer 3 and the relation between the impurity concentration and the depletion layer width illustrated in FIGS. 9 and 10.

Therefore, in order to obtain the low VFin in the diode D1 of the first embodiment, the thickness of the first portion 3FA of the p-type layer 3 below the anode electrode 4A is preferably in the range of the hatched part SL and the area B lower than the hatched part SL illustrated in FIGS. 9 and 10. Also, the impurity concentration of the first portion 3FA of the p-type layer 3 is preferably, for example, about $1 \times 10^{16}$ cm$^{-3}$ to $1 \times 10^{19}$ cm$^{-3}$, and more preferably, $1 \times 10^{17}$ cm$^{-3}$ to $5 \times 10^{18}$ cm$^{-3}$.

Even if the first portion 3FA has a film thickness positioned at the boundary between the hatched part SL and the area A illustrated in FIGS. 9 and 10, it is estimated from the above-described results that the VFin can be set at a value of 1.3 V at the maximum or lower by the control to the above-described range.

The high breakdown voltage can be obtained according to the diode D1 of the first embodiment obtained by controlling the thickness of the first portion 3FA and controlling the impurity concentration thereof, and further, providing the second portion 3SA thicker than the first portion 3FA so as to surround the first portion 3FA.

Also, in the diode D1 of the first embodiment, the sufficiently favorable reverse characteristics can be obtained even with a simpler structure than that of the JBS or others.

Next, an example of a method of manufacturing the diode D1 of the first embodiment will be described below with reference to FIGS. 11 to 14. FIGS. 11 to 14 are cross-sectional views of a principal part of the substrate 1 in a process of manufacturing the diode D1 of the first embodiment.

Figure 11:
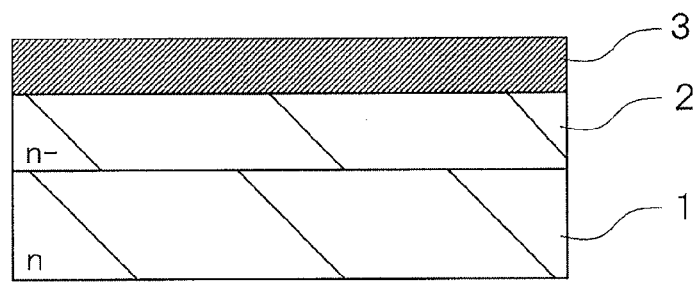
FIG. 11 is a cross-sectional view of a principal part of a nitride semiconductor substrate in a process of manufacturing the nitride semiconductor element of FIG. 1.

First, as illustrated in FIG. 11, the n⁻-type layer 2 and the p-type layer 3 are sequentially epitaxially grown on the first surface of the substrate 1 by using a publicly-known MOVPE (Metal Organic Vapor Phase Epitaxy) method.

The substrate 1 is formed of, for example, the n-type GaN. Also, a Si doping concentration of the n⁻-type layer 2 is, for example, $1 \times 10^{16}$ cm$^{-3}$, and a thickness thereof is, for example, 10 μm. Further, in the p-type layer 3, a p-type layer having a Mg doping concentration of, for example, $2 \times 10^{20}$ cm$^{-3}$, and a thickness of, for example, 20 nm, is sequentially deposited on a p-type layer having a Mg doping concentration of, for example, $1 \times 10^{18}$ cm$^{-3}$, and a thickness of, for example, 50 nm from a side close to the n⁻-type layer 2.

Figure 12:
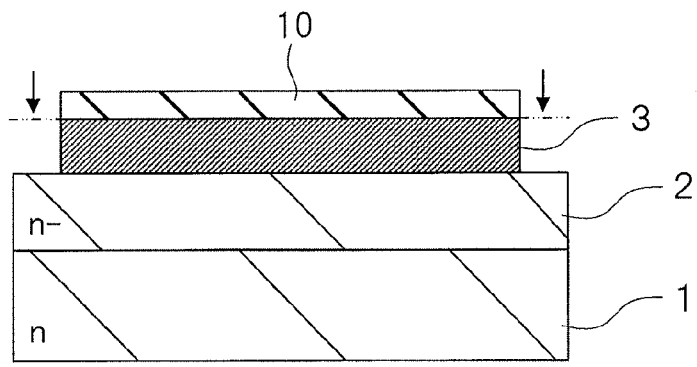
FIG. 12 is a cross-sectional view of a principal part of the nitride semiconductor substrate in the process of manufacturing the nitride semiconductor element, continued from FIG. 11.

Subsequently, as illustrated in FIG. 12, a mesa etching mask pattern 10 is formed on the p-type layer 3. The mesa etching mask pattern 10 is made of, for example, silicon oxide (such as SiO$_2$), and is formed so as to cover the region where the p-type layer 3 is desired to remain.

Then, a portion of the p-type layer 3 exposed from the mesa etching mask pattern 10 is etched and removed by plasma etching (dry etching) mainly with, for example, chlorine gas using the mesa etching mask pattern 10 as an etching mask. In this manner, a pattern of the p-type layer 3 with a mesa structure is formed.

Figure 13:
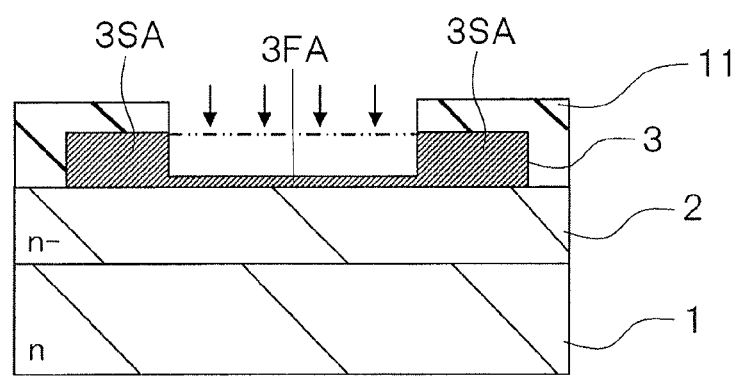
FIG. 13 is a cross-sectional view of a principal part of the nitride semiconductor substrate in the process of manufacturing the nitride semiconductor element, continued from FIG. 12.

Next, after the mesa etching mask pattern 10 is removed, a mask pattern 11 for forming a guard ring is formed on the substrate 1 and the p-type layer 3 as illustrated in FIG. 13. This mask pattern 11 is made of, for example, silicon oxide (such as SiO$_2$), and is formed so as to expose the formation region of the firs portion 3FA and so as to cover the other region.

Subsequently, the portion of the p-type layer 3 exposed from the mask pattern 11 is etched and removed down to a predetermined depth (a depth in which a part of the p-type layer 3 remains at a bottom portion) by plasma etching (dry etching) using chlorine-based gas by using this mask pattern 11 as an etching mask.

In this manner, the p-type layer 3 is formed in a concave cross-sectional shape having the relatively-thin first portion 3FA and the relatively-thick second portion 3SA in the outer circumference of the first portion 3FA. The thickness (residual thickness) of the first portion 3FA is, for example, 10 to 15 nm.

Then, a heat treatment is performed on the epitaxial substrate including the substrate 1 for which all the semiconductor etching processes have been completed, so as to activate carriers of the p-type layer 3. A temperature of the heat treatment at this time is preferably in a range of, for example, 600 to 900° C.

Figure 14:
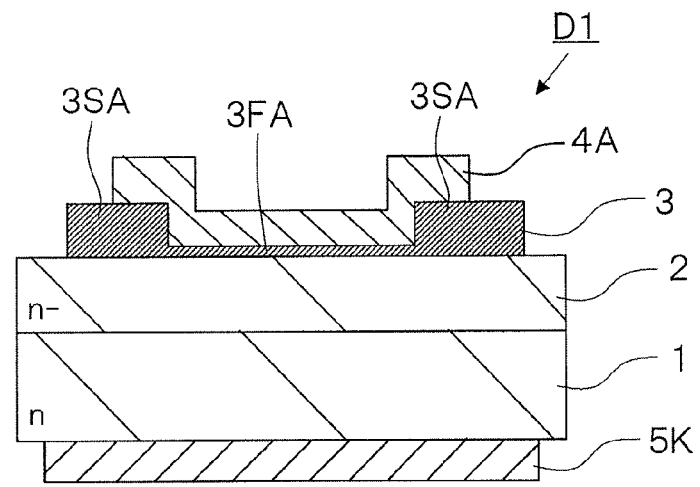
FIG. 14 is a cross-sectional view of a principal part of the nitride semiconductor substrate in the process of manufacturing the nitride semiconductor element, continued from FIG. 13.

Further, then, as illustrated in FIG. 14, the anode electrode (Schottky electrode) 4A is formed on the p-type layer 3, and the cathode electrode (ohmic electrode) 5K is formed on the second surface of the substrate 1, so that the diode D1 of the first embodiment is completed.

The anode electrode 4A is made of, for example, Pd. Also, the cathode electrode 5K is formed by, for example, sequentially depositing Ti and Al from a side close to the second surface.

A plan view of the diode D1 at the stage of FIG. 14 is as illustrated in FIG. 1. The anode electrode 4A is formed in a flat circular shape, and is formed inner than the outer circumference of the second portion 3SA of the p-type layer 3.

In the first embodiment described above, the example where the heat treatment for activating the carriers of the p-type layer 3 is performed after the completion of all the semiconductor etching processes has been described. However, the present invention is not limited to this. The heat treatment may be performed at any stage as long as after the formation of the p-type layer 3 but before the formation of the anode electrode 4A or the cathode electrode 5K.

(Second Embodiment)

Figure 15:
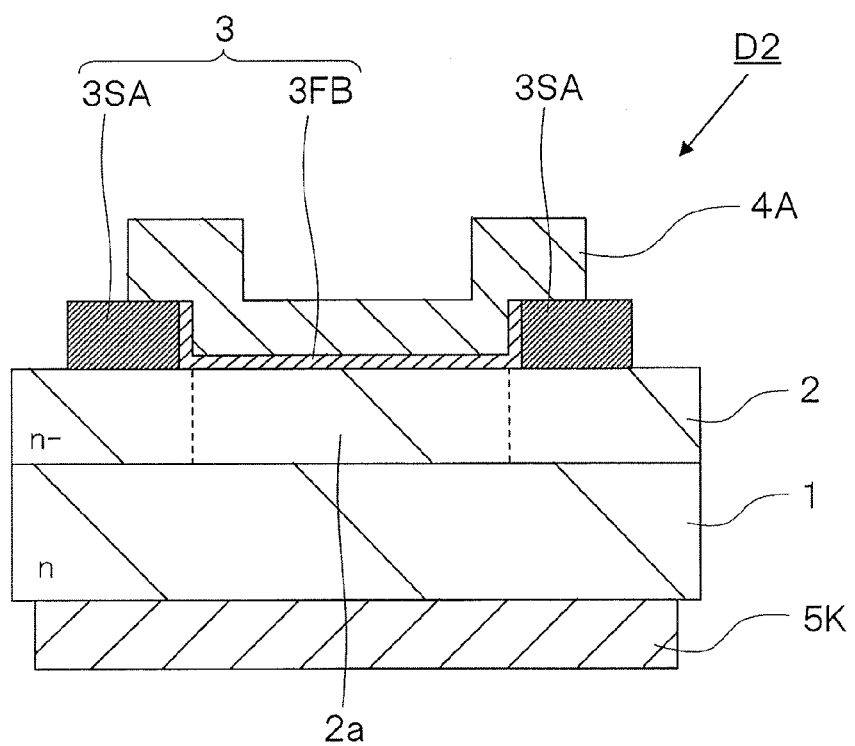
FIG. 15 is a cross-sectional view of a portion of a nitride semiconductor element of a second embodiment of the present invention, the portion corresponding to the line I-I of FIG. 1.

FIG. 15 is a cross-sectional view of a portion of a diode D2, which is a nitride semiconductor element of a second embodiment, corresponding to a line I-I of FIG. 1.

As similar to the diode D1 of the first embodiment, the diode D2 of the second embodiment is the vertical-type SBD. This diode D2 is different from the first embodiment in a structure that a relatively-thin first portion 3FB of the p-type layer 3 is formed by a regrowth technique. Therefore, the anode electrode 4A is connected with the first portion 3FB formed by the regrowth technique in the state of the Schottky junction therewith.

The first portion 3FB of the diode D2 is made of, for example, p-type GaN containing Mg. A Mg doping concentration of the first portion 3FB is, for example, $1\times10^{19}$ cm$^{-3}$, and a thickness thereof is, for example, 10 nm (a thickness on a flat surface). The first portion 3FB is preferably made of a material connected with the n$^-$-type layer 2 as a base material in a state of a homo junction therewith, that is, a material whose crystal is the same as a crystal of the n$^-$-type layer 2 as the base material. The second portion 3SA of the p-type layer 3 is the same as that described in the first embodiment, and therefore, description for that is omitted here.

Next, an example of a method of manufacturing the diode D2 of the second embodiment will be described.

First, after the same manufacturing process as described with reference to FIGS. 11 and 12, the portion of the p-type layer 3 exposed from the mask pattern 11 is entirely etched and removed in the plasma dry etching process mainly with the chlorine-based gas described with reference to FIG. 13, so as to expose the front surface of the n$^-$-type layer 2 serving as a lower layer.

Subsequently, while the mask pattern 11 remains, the first portion 3FB made of, for example, the p-type GaN containing Mg, is selectively re-grown by homo epitaxial growth on the front surface of the n$^-$-type layer 2 surrounded by the second portion 3SA and an inner side surface of the second portion 3SA. A Mg doping concentration of the first portion 3FB is, for example, $1\times10^{19}$ cm$^{-3}$, and a thickness thereof is, for example, 10 nm (a thickness on a flat surface).

The processes after this are the same as those of the method of manufacturing the diode D1 of the first embodiment, and therefore, description thereof is omitted here.

In the diode D2 of the second embodiment, a thickness of the first portion 3FB formed by regrowth is determined by the graphs illustrated in FIGS. 9 and 10, and is within a range of an optimum value in order to achieve the preferred aim of the second embodiment.

The VFin of the diode D2 manufactured in the second embodiment has been, for example, 0.9 V, which is a value higher by about 0.1 V than that of the standard SBD characteristics.

Also, when a diameter of the first portion 3FB of the diode D2 is set at, for example, 300 μmφ, the reverse breakdown voltage of the diode D2 has been 910 V at the maximum, and the reverse leakage current immediately before the breakdown has been $1\times10^{-6}$ A or lower, that is favorably low.

From the above-described result, the diode D2 having the low VFin and the high reverse breakdown voltage has been able to be obtained also by using the regrowth technique to thinly provide the first portion 3FB (p-type layer 3) on the damaged layer caused on the front surface of the n$^-$-type layer 2 by the dry etching.

(Third Embodiment)

Figure 16:
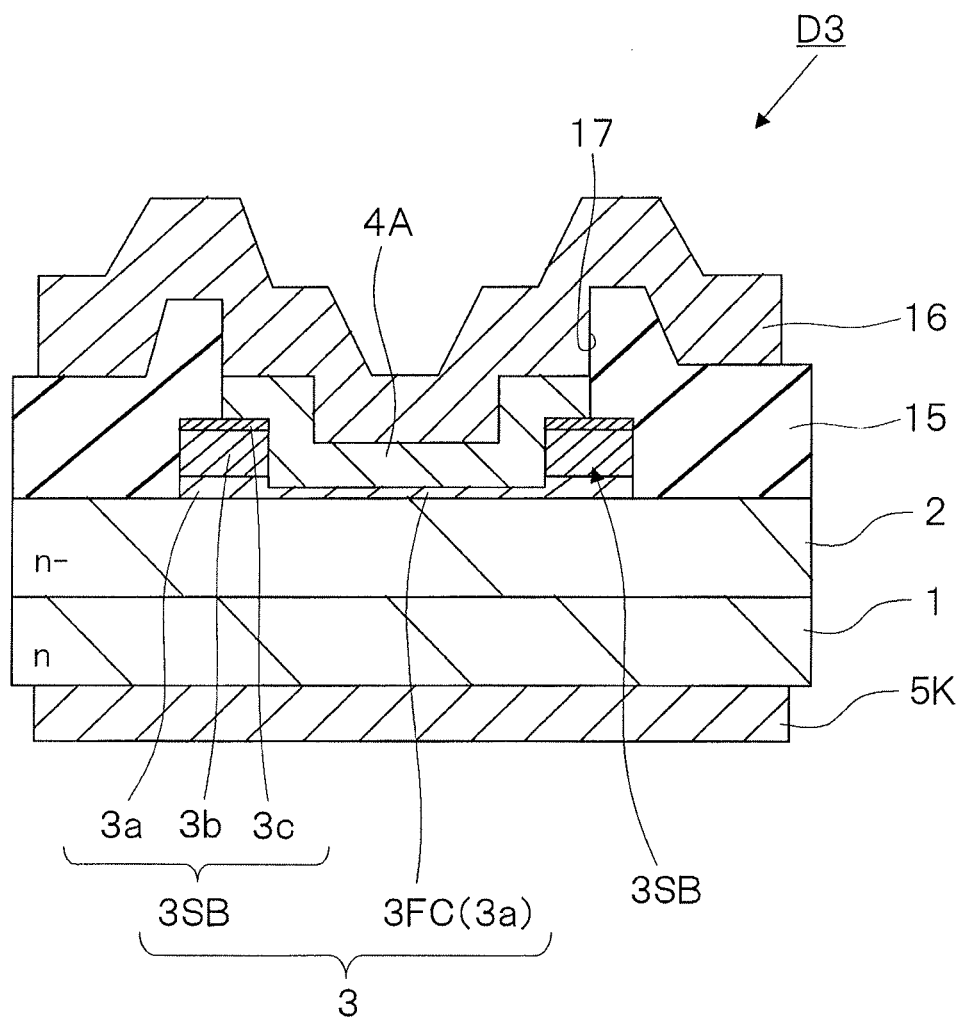
FIG. 16 is a cross-sectional view of a portion of a nitride semiconductor element of a third embodiment of the present invention, the portion corresponding to the line I-I of FIG. 1.

FIG. 16 is a cross-sectional view of a portion of a diode D3, which is a nitride semiconductor element of a third embodiment, corresponding to the line I-I of FIG. 1.

As similar to the diode D1 of the first embodiment, the diode D3 of the third embodiment is the vertical-type SBD. This diode D3 is different from the first embodiment in a structure with the following points.

In the diode D3 of the third embodiment, a Si doping concentration of the n$^-$-type layer 2 is, for example, $8\times10^{15}$ cm$^{-3}$, and a thickness thereof is, for example, 20 μm.

Also, a Mg doping concentration of the second portion 3SB of the p-type layer 3 of the diode D3 is changed into, for example, three stages (a low-concentration p-type layer 3a, an intermediate-concentration p-type layer 3b, and a high-concentration p-type layer 3c) so as to be higher as being farther away from the n$^-$-type layer 2.

A Mg doping concentration of the low-concentration p-type layer 3a which is the lowest layer of the p-type layer 3 is, for example, $5\times10^{17}$ cm$^{-3}$, and a thickness thereof is, for example, 100 nm. A Mg doping concentration of the intermediate-concentration p-type layer 3b which is the intermediate layer of the p-type layer 3 is, for example, $5\times10^{18}$ cm$^{-3}$, and a thickness thereof is, for example, 400 nm. A Mg doping concentration of the high-concentration p-type layer 3c which is the highest layer of the p-type layer 3 is, for example, $2\times10^{20}$ cm$^{-3}$, and a thickness thereof is, for example, 20 nm.

In the diode D3, the relatively-thin first portion 3FC of the p-type layer 3 is formed of the low-concentration p-type layer 3a, and the thickness (residual thickness) of the first portion 3FC is, for example, 45 nm or lower.

Also, in the diode D3, the relatively-thick second portion 3SB of the p-type layer 3 is formed by depositing the low-concentration p-type layer 3a, the intermediate-concentration p-type layer 3b, and the high-concentration p-type layer 3c sequentially from a side close to the n⁻-type layer 2. Note that FIG. 16 exemplifies the case that the low-concentration p-type layer 3a of the first portion 3FC is formed so as to have a thickness thinner than that of the low-concentration p-type layer 3a of the second portion 3SB.

A reason why the impurity concentration of the p-type layer 3 is configured as described above is as follows.

Regarding the Mg doping concentration of the p-type layer 3 of the diode D3, as illustrated in FIGS. 9 and 10, the depletion layer width from the Schottky junction part is larger as the Mg doping concentration is lower. Therefore, by decreasing the Mg doping concentration of the p-type layer 3, the thickness of the first portion 3FC which is allowable for the depletion of the first portion 3FC (that is, the low-concentration p-type layer 3a) can be increased. That is, the first portion 3FC which finally remains by the plasma etching can be thickened, and therefore, the likelihood of the control for the etching amount by the plasma etching is increased by the thickening. Therefore, the diode D3 can be manufactured easier, so that an yield of the diode D3 can be improved.

However, if the Mg concentration of the entire p-type layer 3 is decreased too much, the spreading of the depletion layer is large in the thickness direction of the second portion 3SB at the time of the application of the reverse voltage, and it is concerned that the large spreading affects the breakdown voltage characteristics. Therefore, it is preferred that the Mg concentration in a region other than the first portion 3FC (the low-concentration p-type layer 3a) in the p-type layer 3 is high, and therefore, the concentration has been set as described above in the third embodiment.

Also in the diode D3 of the third embodiment, a protective film (an insulating film) 15 is deposited on the n⁻-type layer 2, and a field plate electrode (a third electrode) 16 is formed on the protective film 15.

The protective film 15 is deposited so as to cover an upper surface of the second portion 3SB of the p-type layer 3 outer than the outer circumference of the anode electrode 4A and also cover a side surface (a mesa side surface) of the outer circumference of the second portion 3SB and an upper surface of the n⁻-type layer 2 outer than the outer circumference of the second portion 3SB.

Also, the protective film 15 is formed of, for example, a single-layered insulating film made of silicon oxide (such as $SiO_2$) and has a thickness of, for example, 1.0 μm. The thickness of the protective film 15 is, for example, at least 300 nm or larger in order to obtain an effect functioned as a field plate electrode 16 described later. However, if the protective film 15 is too thick, electric field concentration in the n⁻-type layer 2 below the outer circumference of the anode electrode 4A cannot be relaxed. From these matters, it is preferred that the thickness of the protective film 15 is in a range of 300 nm to 1 μm.

However, the material of the protective film 15 is not limited to silicon oxide, and may be made of any material as long as the material is a general dielectric insulating film material used for a normal semiconductor element, such as a silicon nitride (SiN) film, a silicon oxynitride (SiON) film, or an aluminum oxide ($Al_2O_3$) film. Also, the protective film 15 may be formed of a single-layered insulating film made of the above-described insulating material, or may be formed of a multi-layered insulating film obtained by laminating single-layered insulating films.

The field plate electrode 16 is made of, for example, Al, and is electrically connected with the anode electrode 4A via a hole 17 bored in the protective film 15.

Also, an outer circumference of the field plate electrode 16 is formed so as to protrude outer than the outer circumference of the anode electrode 4A, more preferably, the outer circumference of the second portion 3SB of the p-type layer 3. By providing such a field plate electrode 16, the high reverse breakdown voltage characteristics have been obtained in the diode D3.

Figure 17:
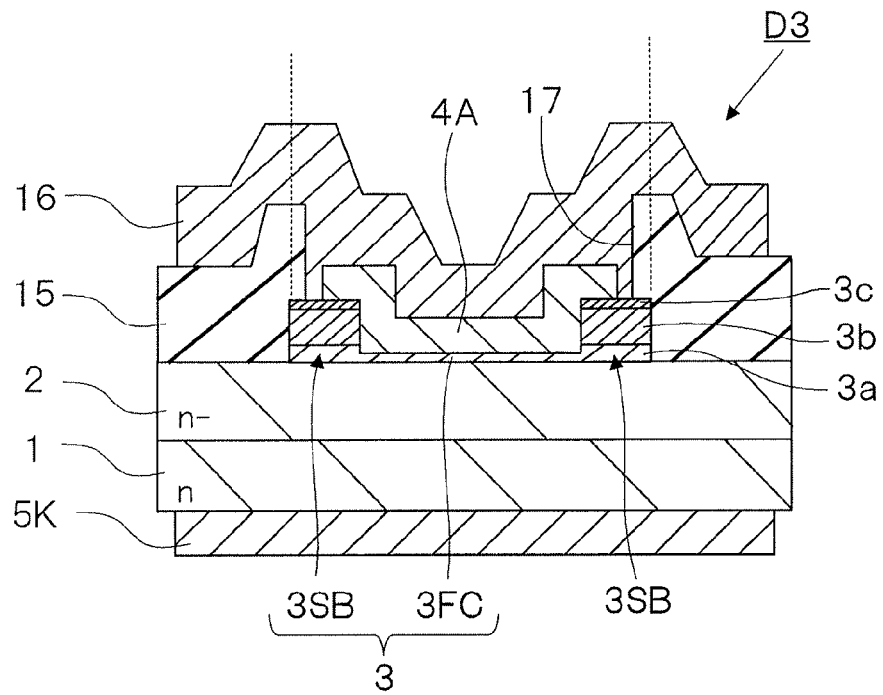
FIG. 17 is a cross-sectional view of the nitride semiconductor substrate for describing a positional relation between a p-type nitride semiconductor layer and a hole of the nitride semiconductor element of FIG. 16.
Figure 18:
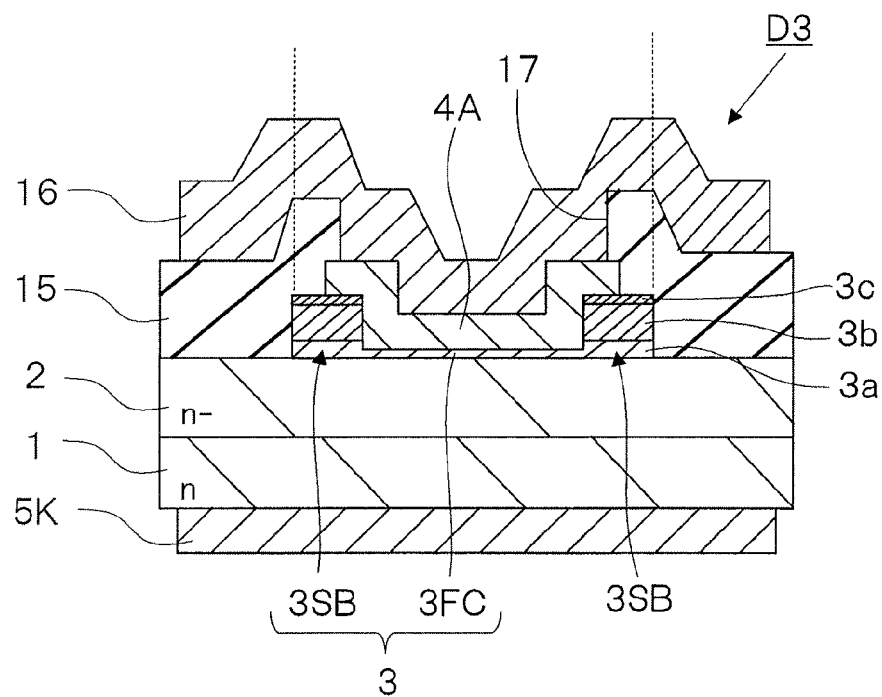
FIG. 18 is another cross-sectional view of the nitride semiconductor substrate for describing the positional relation between the p-type nitride semiconductor layer and the hole of the nitride semiconductor element of FIG. 16.

Next, FIGS. 17 and 18 are cross-sectional views of the substrate 1 for describing a positional relation between the p-type layer 3 and the hole 17. Note that broken lines in FIGS. 17 and 18 indicate a position of the outer circumference of the second portion 3SB of the p-type layer 3.

As illustrated in FIGS. 17 and 18, the hole 17 may be placed anywhere as long as being inner than the outer circumference of the second portion 3SB of the p-type layer 3. FIG. 17 illustrates a case that an outer circumference of the hole 17 is placed outer than the outer circumference of the anode electrode 4A. In this case, although the field plate electrode 16 and the second portion 3SB of the p-type layer 3 maybe in direct contact with each other, this is no problem. Also, FIG. 18 illustrates a case that the outer circumference of the hole 17 is placed inner than the outer circumference of the anode electrode 4A.

In manufacturing the diode D3 of the third embodiment, as similar to the description in the first embodiment, the n⁻-type layer 2 is formed on the substrate 1, and then, the low-concentration p-type layer 3a, the intermediate-concentration p-type layer 3b, and the high-concentration p-type layer 3c are sequentially deposited on the n⁻-type layer 2 from a side close to the n⁻-type layer 2 by the epitaxial method or others. Subsequently, as similar to the description with reference to FIG. 12, a pattern of the p-type layer 3 with the mesa structure is formed on the p-type layer 3 having the depositing structure by chlorine-based plasma dry etching. Then, as similar to the description with reference to FIG. 13, the first portion 3FC is formed of a part (an etching residual part) of the p-type layer 3 by the chlorine-based plasma dry etching. Other processes are the same those of the first embodiment, and therefore, description thereof is omitted.

In such a diode D3 of the third embodiment, the VFin has been in a range of, for example, 1.0 to 1.1 V.

Figure 19:
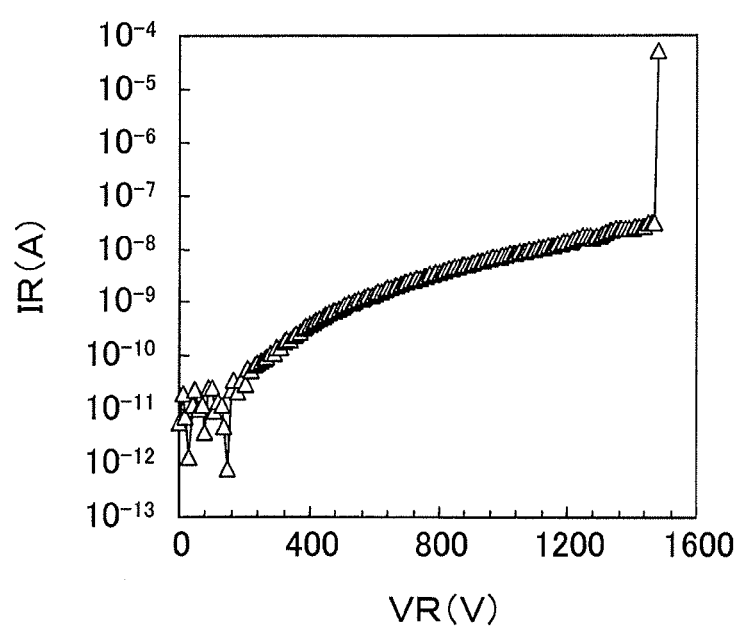
FIG. 19 is a graph of evaluation results of reverse current-voltage characteristics of the nitride semiconductor element of FIG. 16.

FIG. 19 is a graph of evaluation results of reverse current-voltage characteristics of the diode D3 of the third embodiment. When a diameter of the first portion 3FC of the diode D3 is set to, for example, 300 μmϕ, the reverse breakdown voltage of the diode D3 is 1.47 kV which has been extremely high as illustrated in FIG. 19, and the diode D3 had a favorable characteristic, with, and the reverse leakage current immediately before the breakdown is $2 \times 10^{-8}$ A which is low and favorable characteristics.

Also, in the diode D3 of the third embodiment, by providing the field plate electrode 16 in addition to the guard ring part structured of the second portion 3SB of the p-type layer 3 as described above, the breakdown voltage characteristics with the significantly high breakdown voltage can be obtained.

(Fourth Embodiment)

Figure 20:
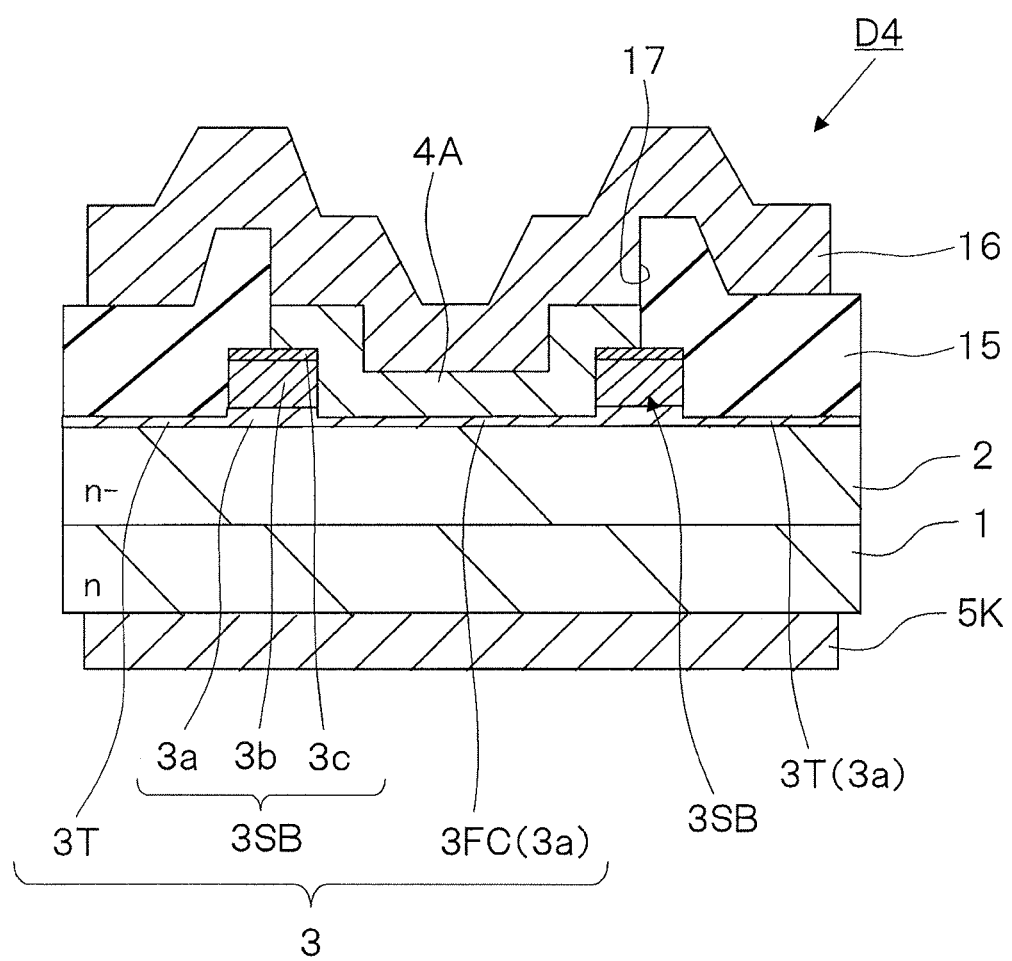
FIG. 20 is a cross-sectional view of a portion of a nitride semiconductor element of a fourth embodiment of the present invention, the portion corresponding to the line I-I of FIG. 1.

FIG. 20 is a cross-sectional view of a portion of a diode D4, which is a nitride semiconductor element of a fourth embodiment, corresponding to the line I-I of FIG. 1.

As similar to the diode D1 of the first embodiment, the diode D4 of the fourth embodiment is the vertical-type SBD. This diode D4 is different from the first and third embodiments in a structure with the following points.

In the diode D4 of the fourth embodiment, the p-type layer 3 has the first portion 3FC, the second portion 3SB provided as being in contact with an outer circumference of the first portion 3FC, and a third portion 3T provided so as to surround the second portion 3SB.

The third portion 3T of the p-type layer 3 is formed on the n⁻-type layer 2 from an outer circumference of the second portion 3SB to an outer circumference of the substrate 1. This third portion 3T is formed of the low-concentration p-type layer 3a.

However, a Mg doping concentration of the first portion 3FC, the second portion 3SB, and the low-concentration p-type layer 3a of the third portion 3T is lower than the impurity concentration of the p-type layer 3a of the third embodiment, and is, for example, $1 \times 10^{17}$ cm$^{-3}$.

Also, a thickness (residual thickness) of the first portion 3FC and the low-concentration p-type layer 3a of the third portion 3T has been controlled in a range of, for example, 60 to 70 nm. Also, a thickness of the low-concentration p-type layer 3a of the second portion 3SB is, for example, 100 nm as similar to that of the third embodiment.

Further, the protective film 15 is formed of a PSG (Phosphorous Silicate Glass) film having a thickness of, for example, 1.5 μm.

Figure 21:
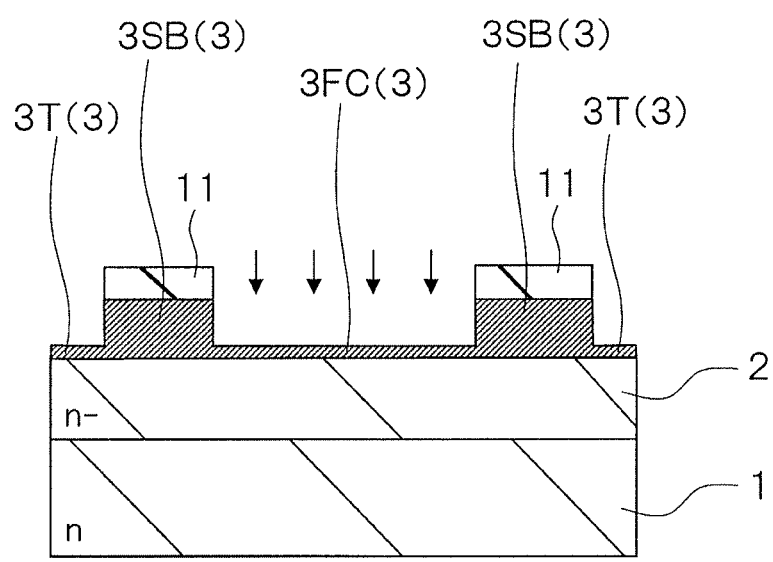
FIG. 21 is a cross-sectional view of a principal part of the nitride semiconductor element of FIG. 20 in a process of manufacturing the same.

Next, FIG. 21 is a cross-sectional view of a principal part in the process of manufacturing the diode D4 of the fourth embodiment.

In the fourth embodiment, as illustrated in FIG. 21, the mesa structure outside the second portion 3SB is also formed at the same time with the formation of the first portion 3FC by the plasma etching using the chlorine-based gas by using the mask pattern 11 as the etching mask. Therefore, the third portion 3T (that is, the low-concentration p-type layer 3a) having the same thickness as that of the first portion 3FC is formed outer than the outer circumference of the second portion 3SB.

In such a diode D4 of the fourth embodiment, for example, the VFin has been in a range of 0.9 to 0.95 V, the n value has been in a range of 1.07 to 1.08, and the φb has been in a range of 1.23 to 1.26 eV.

Still further, when a diameter of the first portion 3FC of the diode D4 is set to, for example, 300 μmφ, the reverse breakdown voltage of the diode D4 has been showed as a high value of 1.4 kV or higher, the reverse leakage current immediately before the breakdown has been showed as $1 \times 10^{-8}$ A or lower to be the favorable characteristics, which is further lower than that of the diode D3 of the third embodiment.

This indicates that the characteristics of the diode D4 are not influenced by even the remaining of the depleted low-concentration p-type layer 3a on the front surface of the n--type layer 2 outer than the outer circumference of the second portion 3SB of the p-type layer 3. In addition, the reverse leakage current has been a lower value than the case that the n⁻-type layer 2 is exposed without the low-concentration p-type layer 3a remaining on the front surface of the n⁻-type layer 2 outer than the outer circumference of the second portion 3SB. In this manner, a current loss can be reduced in the diode D4.

A reason why the reverse leakage current decreases is considered as follows. When the low-concentration p-type layer 3a does not remain on the n⁻-type layer 2 outer than the outer circumference of the second portion 3SB of the p-type layer 3, the damaged layer is caused on the front surface of the n⁻-type layer 2 outer than the outer circumference of the second portion 3SB by the plasma etching for the p-type layer 3. Therefore, a current leakage path is formed at a contact interface between the n⁻-type layer 2 having the damaged layer and the protective film 15. On the other hand, when the low-concentration p-type layer 3a remains on the n⁻-type layer 2 outer than the outer circumference of the second portion 3SB, the damaged layer is not formed on the front surface of the n⁻-type layer 2, and the current leakage path is not formed.

In the foregoing, the invention made by the present inventors has been concretely described based on the embodiments. However, it is needless to say that the present invention is not limited to the foregoing embodiments and various modifications and alterations can be made within the scope of the present invention.

For example, the embodiments described above have been described in detail in order to easily understand the present invention, and the present invention is not necessarily limited to those including all structures described above. Also, the structure of one embodiment can be partially replaced by the structure of anther embodiment, and the structure of another embodiment can be added to the structure of the one embodiment. Further, another structure can be added to/eliminated from/replaced by a part of the structure of each embodiment.

The first to fourth embodiments have described the case that the planar surface shape of the first portion of the p-type layer 3 connected with the anode electrode in the state of the Schottky junction is the circular shape. However, the present invention is not limited to the case, and the planar shape may be any shape such as a rectangular shape or a hexagonal shape whose corners are rounded as long as the shape belongs to an efficient and general-knowledge range in the manufacturing the element.

Also, the first portion of the p-type layer 3 may be formed so as to be divided into a plurality of pieces. In this case, it is preferred to structure a diode by electrically connecting between the pieces that normally operate from among the plurality of pieces of the first portion.

Still further, the second portion serving as the guard ring of the p-type layer 3 may be formed so as to surround the first portion, and may be deformed in accordance with the planar shape of the first portion or the number of the first portions.

What is claimed is:

1. A nitride semiconductor element comprising:
a nitride semiconductor substrate of a first conductive type, the nitride semiconductor substrate having a first surface and a second surface on a back side of the first surface;
a nitride semiconductor layer of the first conductive type provided on the first surface side of the nitride semiconductor substrate of the first conductive type;
a nitride semiconductor layer of a second conductive type, provided on the nitride semiconductor layer of the first conductive type, having a first portion and a second portion provided so as to surround the first portion, and set as having a conductive type opposite to the first conductive type;
a first electrode having a portion connected with the first portion in a state of a Schottky junction and a portion connected with the second portion in a state of an ohmic junction; and
a second electrode provided on the second surface side of the nitride semiconductor substrate of the first conductive type, and
a film thickness of the first portion being thinner than a film thickness of the second portion so as to be depleted.

2. The nitride semiconductor element according to claim 1, wherein the nitride semiconductor element further includes:
an insulating film provided on the first surface side of the nitride semiconductor substrate of the first conductive type so as to cover the nitride semiconductor layer of the second conductive type and the first electrode; and a third electrode electrically connected with the first electrode via a hole formed inner than an outer circumference of the second portion in the insulating film so that the first electrode is exposed, and an outer circumference of the third electrode is formed so as to protrude outer than an outer circumference of the first electrode.

3. The nitride semiconductor element according to claim 2, wherein the insulating film is formed of a single-layered insulating film or a multi-layered insulating film obtained by laminating single-layered insulating films, and a thickness of the insulating film is equal to or larger than 300 nm.

4. The nitride semiconductor element according to claim 1, wherein an impurity concentration of the second portion is set to be higher toward a direction farther away from the first surface of the nitride semiconductor substrate of the first conductive type.

5. The nitride semiconductor element according to claim 1, wherein the nitride semiconductor layer of the second conductive type further has a third portion provided so as to surround an outer circumference of the second portion and so as to have a film thickness thinner than a film thickness of the second portion.

6. The nitride semiconductor element according to claim 1, wherein the first portion is entirely depleted.

7. The nitride semiconductor element according to claim 1, wherein the first conductive type is an n type,
the second conductive type is a p type, and
an impurity concentration of the first portion is $1\times10^{16}$ cm$^{-3}$ to $1\times10^{19}$ cm$^{-3}$.

8. The nitride semiconductor element according to claim 1, wherein the nitride semiconductor element is a diode,
the first electrode is an anode electrode,
the second electrode is a cathode electrode, and
the second portion is a guard ring part.

9. The nitride semiconductor element according to claim 1, wherein the nitride semiconductor substrate of the first conductive type is an n-type gallium nitride substrate.

10. A method of manufacturing a nitride semiconductor element comprising the steps of:
preparing a nitride semiconductor substrate of a first conductive type, the nitride semiconductor substrate having a first surface and a second surface on a back side of the first surface;
forming a nitride semiconductor layer of the first conductive type on the first surface side of the nitride semiconductor substrate;
forming a nitride semiconductor layer of a second conductive type, provided on the nitride semiconductor layer of the first conductive type, having a first portion and a second portion provided so as to surround the first portion, and set as having a conductive type opposite to the first conductive type;
forming a first electrode having a portion connected with the first portion in a state of a Schottky junction and a portion connected with the second portion in a state of an ohmic junction; and forming a second electrode on the second surface side of the nitride semiconductor substrate of the first conductive type, and
a film thickness of the first portion being thinner than a film thickness of the second portion so as to be depleted.

11. The method of manufacturing the nitride semiconductor element according to claim 10,
wherein the step of forming the nitride semiconductor layer of the second conductive type includes the steps of:
depositing a nitride semiconductor of the second conductive type on the nitride semiconductor layer of the first conductive type; and
forming the first portion by causing a part of the nitride semiconductor of the second conductive type to remain when an etching process is performed to the nitride semiconductor of the second conductive type.

12. The method of manufacturing the nitride semiconductor element according to claim 10,
wherein the step of forming the nitride semiconductor layer of the second conductive type includes the steps of:
depositing a nitride semiconductor of the second conductive type on the nitride semiconductor layer of the first conductive type,
forming the second portion formed of the nitride semiconductor of the second conductive type by etching and removing an entire region where the first portion is formed, in the nitride semiconductor of the second conductive type, and
forming the first portion by re-growing the nitride semiconductor of the second conductive type in a region surrounded by the second portion.

13. The method of manufacturing the nitride semiconductor element according to claim 10,
wherein the method further includes a step of performing a heat treatment on the nitride semiconductor substrate at 600 to 900° C. after the nitride semiconductor layer of the second conductive type is formed but before the first electrode or the second electrode is formed.

14. The method of manufacturing the nitride semiconductor element according to claim 10,
wherein the method further includes the steps of:
depositing an insulating film on the first surface side of the nitride semiconductor substrate so as to cover the nitride semiconductor layer of the second conductive type and the first electrode;
forming a hole inner than an outer circumference of the second portion in the insulating film so that the first electrode is exposed; and
forming, on the insulating film, a third electrode so as to be electrically connected with the first electrode via the hole and so that an outer circumference of the third electrode protrudes outer than an outer circumference of the first electrode.

15. The method of manufacturing the nitride semiconductor element according to claim 10,
wherein an impurity concentration of the second portion of the nitride semiconductor layer of the second conductive type is higher toward a direction farther away from the first surface of the nitride semiconductor substrate.

* * * * *